(12) United States Patent
Fermann et al.

(10) Patent No.: US 10,454,238 B2
(45) Date of Patent: Oct. 22, 2019

(54) SYSTEMS AND METHODS FOR LOW NOISE FREQUENCY MULTIPLICATION, DIVISION, AND SYNCHRONIZATION

(71) Applicant: IMRA America, Inc., Ann Arbor, MI (US)

(72) Inventors: Martin E. Fermann, Dexter, MI (US); Naoya Kuse, Longmont, CO (US)

(73) Assignee: IMRA America, Inc., Ann Arbor, MI (US)

( * ) Notice: Subject to any disclaimer, the term of this patent is extended or adjusted under 35 U.S.C. 154(b) by 0 days.

(21) Appl. No.: 15/725,849

(22) Filed: Oct. 5, 2017

(65) Prior Publication Data

US 2018/0048113 A1    Feb. 15, 2018

Related U.S. Application Data

(63) Continuation of application No. PCT/US2016/025527, filed on Apr. 1, 2016.
(Continued)

(51) Int. Cl.
*H01S 3/13* (2006.01)
*H01S 3/067* (2006.01)
(Continued)

(52) U.S. Cl.
CPC .......... *H01S 3/1304* (2013.01); *H01S 3/0014* (2013.01); *H01S 3/0085* (2013.01);
(Continued)

(58) Field of Classification Search
CPC .... H01S 3/1304; H01S 3/0085; H01S 3/1306; H01S 3/06712; H01S 3/1307;
(Continued)

(56) References Cited

U.S. PATENT DOCUMENTS 5,450,427 A    9/1995  Fermann et al.
5,723,856 A    3/1998  Yao et al.
(Continued)

FOREIGN PATENT DOCUMENTS

JP    2013-120202    6/2013
JP    2014-135341    7/2014
(Continued)

OTHER PUBLICATIONS

J. Kakande, et al., "Overcoming Electronic Limits to Optical Phase Measurements with an Optical Phase-only Amplifier," Optical Fiber Communication Conference and Exposition (OFC/NFOEC), 2012 and The National Fiber Optic Engineers Conference, IEEE, Mar. 4, 2012, in 3 pages.
(Continued)

*Primary Examiner* — Leslie C Pascal
(74) *Attorney, Agent, or Firm* — Knobbe, Martens, Olson & Bear, LLP

(57) ABSTRACT

Low phase noise radio frequency (RF) sources generated by voltage controlled oscillators (VCOs) are described. Optical modulators driven by a VCO may be used to generate optical side-bands to cw lasers. The spectral extent of said side-bands can be increased via frequency broadening in highly nonlinear waveguides. Free running mode locked low phase noise comb oscillators can be used as reference oscillators to generate beat signals between those side-bands and individual comb modes at distal spectral regions, thereby creating an error signal used to reduce the phase noise of VCOs and the generation of low phase noise RF signals. VCO phase noise may be reduced by using free-running mod-elocked comb lasers phase locked to external frequency references, by omitting a reference comb and using a non-linear interferometer for generating an error signal, or by
(Continued)

locking a slave comb to the modulation frequency of an intra-cavity modulator driven by the VCO.

19 Claims, 14 Drawing Sheets

Related U.S. Application Data

(60) Provisional application No. 62/144,736, filed on Apr. 8, 2015, provisional application No. 62/219,868, filed on Sep. 17, 2015, provisional application No. 62/299,239, filed on Feb. 24, 2016.

(51) Int. Cl.
  *H01S 3/00* (2006.01)
  *H03B 17/00* (2006.01)
  *H01S 3/107* (2006.01)
  *H01S 3/11* (2006.01)
  *H01S 3/136* (2006.01)
  *H01S 3/23* (2006.01)
  *H03D 7/14* (2006.01)
  *H03F 3/08* (2006.01)
  *H03L 7/24* (2006.01)

(52) U.S. Cl.
  CPC ........ *H01S 3/0092* (2013.01); *H01S 3/06712* (2013.01); *H01S 3/06791* (2013.01); *H01S 3/1306* (2013.01); *H01S 3/1307* (2013.01); *H03B 17/00* (2013.01); *H01S 3/0057* (2013.01); *H01S 3/0078* (2013.01); *H01S 3/107* (2013.01); *H01S 3/1118* (2013.01); *H01S 3/1305* (2013.01); *H01S 3/136* (2013.01); *H01S 3/2391* (2013.01); *H03B 2200/009* (2013.01); *H03D 7/14* (2013.01); *H03F 3/08* (2013.01); *H03L 7/24* (2013.01)

(58) Field of Classification Search
  CPC .. H01S 3/0014; H01S 3/06791; H01S 3/0092; H01S 3/0078; H01S 3/107; H01S 3/136; H01S 3/0057; H01S 3/2391; H01S 3/1305; H01S 3/1118; H03B 17/00; H03B 2200/009; H03D 7/14; H03F 3/08; H03L 7/24
  See application file for complete search history.

(56) References Cited

U.S. PATENT DOCUMENTS

| | | | |
|---|---|---|---|
| 5,929,430 A | 7/1999 | Yao et al. | |
| 6,567,436 B1 | 5/2003 | Yao et al. | |
| 6,885,683 B2 | 4/2005 | Fermann et al. | |
| 6,928,091 B1 | 8/2005 | Maleki et al. | |
| 7,026,594 B2 | 4/2006 | Holzwarth et al. | |
| 7,173,749 B2 | 2/2007 | Maleki et al. | |
| 7,389,053 B1 | 6/2008 | Ilchenko et al. | |
| 7,393,567 B2 | 7/2008 | Kawamura | |
| 7,460,746 B2 | 12/2008 | Maleki et al. | |
| 7,593,644 B2 | 9/2009 | Kaertner et al. | |
| 7,649,915 B2 | 1/2010 | Fermann et al. | |
| 7,809,222 B2 | 10/2010 | Hartl et al. | |
| 7,940,390 B2 | 5/2011 | Kaertner et al. | |
| 7,982,944 B2 | 7/2011 | Kippenberg et al. | |
| 8,447,155 B1 | 5/2013 | Kuo et al. | |
| 8,451,528 B1 | 5/2013 | Kuo | |
| 8,787,410 B2 | 7/2014 | Fermann | |
| 8,976,822 B2 | 3/2015 | Maleki et al. | |
| 9,537,571 B2 | 1/2017 | Li et al. | |
| 9,819,141 B2 | 11/2017 | Fermann | |
| 9,831,881 B2 | 11/2017 | Josefsberg et al. | |
| 10,050,407 B1 | 8/2018 | Fernandez et al. | |
| 10,097,307 B2 | 10/2018 | Lyubomirsky | |
| 2004/0263949 A1 | 12/2004 | Gu et al. | |
| 2014/0186045 A1 | 7/2014 | Poddar et al. | |
| 2015/0015936 A1 | 1/2015 | Kuo | |
| 2015/0311662 A1 | 10/2015 | Vahala et al. | |
| 2016/0254646 A1 | 9/2016 | Li et al. | |
| 2017/0187161 A1 | 6/2017 | Fermann et al. | |

FOREIGN PATENT DOCUMENTS

| | | |
|---|---|---|
| WO | WO 2015/073257 | 5/2015 |
| WO | WO 2015/160413 A2 | 10/2015 |
| WO | WO 2015/163954 A2 | 10/2015 |
| WO | WO 2016/048740 | 3/2016 |
| WO | WO 2016/164263 A1 | 10/2016 |

OTHER PUBLICATIONS

J. Millo, et al., "Ultralow noise microwave generation with fiber-based optical frequency comb and application to atomic fountain clock," Applied Physics Letters, AIP Publishing LLC, US, vol. 94, No. 14, Apr. 8, 2009, in 3 pages.

International Search Report and Written Opinion from corresponding International Patent Application No. PCT/US2016/025527, dated Aug. 23, 2016, in 23 pages.

Eliyahu et al., "Low Phase Noise and Spurious Level in Multi-Loop Opto-Electronic Oscillators", Proceedings of the 2003 IEEE International Frequency Control Symposium and PDA Exhibition Jointly with the 17th European Frequency and Time Forum, May 2003, in 6 pages.

Hitomi et al., "Simple method to lock an optical frequency comb to an ultra-stable laser without an RF signal generator", CLEO Pacific Rim 2018, Jul. 2018, paper W2F.5, in 2 pages.

Ishizawa et al., "Carrier-envelope-offset locking of 25-GHz EOM comb based on a free-running CW Laser Diode", CLEO 2018, paper SM4L.5, May 2018, in 2 pages.

Ishizawa et al., "Phase-noise characteristics of a 25-GHz-spaced optical frequency comb based on a phase-and intensity-modulated laser", Optics Express, vol. 21, No. 24, Nov. 2013, in 9 pages.

Ishizawa et al., "Ultralow-phase-noise millimetre wave signal generator assisted with an electro-optics-modulator-based optical frequency comb", Scientific Reports, May 17, 2016, in 20 pages.

Jung et al., "Ultralow Phase Noise Microwave Generation From Mode-Locked Er-Fiber Lasers With Mode-Locked Er-Fiber Lasers With Subfemtosecond Integrated Timing Jitter", IEEE Photonics Journal, vol. 5, No. 3, Jun. 2013, in 7 pages.

Kim et al., "Femtosecond Laser-Based Microwave Signal Generation and Distribution", Journal of Lightwave Technology, vol. 34, No. 20, Oct. 2016, in 9 pages.

Lipphardt et al., "Optical Stabilization of a Microwave Oscillator for Fountain Clock Interrogation", arXiv:1609.05718v1 [physics.atom-ph], Sep. 19, 2016, in 7 pages.

Sun et al., "Frequency synthesis of forced opto-electronic oscillators at the X-band", Chinese Optics Letters, vol. 15, Jan. 10, 2017, pp. 010009-1 to 010009-5.

Xie et al., "Photonic microwave signals with zeptosecond level absolute timing noise", Nature photonics, Jan. 2017, vol. 11(1), in 21 pages.

Xie et al., "Widely Tunable Dual-loop Optoelectronic Oscillator", CLEO 2014, paper Stu2G.2, Jun. 2014, in 3 pages.

Zhang et al., "Advanced noise reduction techniques for ultra-low phase noise optical-to-microwave division with femtosecond fiber combs", IEEE transactions on ultrasonics, ferroelectrics, and frequency control, May 2011, vol. 58(5), in 16 pages.

Zhang et al., "Comparison of Optical Self-Phase Locked Loop Techniques for Frequency Stabilization of Oscillators", IEEE Photonics Journal, vol. 6, No. 5, Oct. 2014, in 16 pages.

J. Chauvin et al., "A New Generation of Very High Stability BVA Oscillators," 2007 IEEE International Frequency Control Symposium Joint with the 21$^{st}$ European Frequency and Time Forum, May 29, 2007, in 8 pages.

(56) References Cited

OTHER PUBLICATIONS

A. Ishizawa et al., Supplementary Information for "Ultralow-noise millimeter-wave signal generator assisted with an electro-optics-modulator based optical frequency comb," Supplementary Information, Scientific Reports, Sep. 2016, in 13 pages.
V. Torres-Company et al., "Optical frequency comb technology for ultra-broadband radio-frequency photonics," Laser & Photonics Reviews, vol. 8, Issue 3, May 2014, in 55 pages.
R. Wu et al., "Supercontinuum-based 10-GHz flat-topped optical frequency comb generation," Optics Express, vol. 21, No. 5, Mar. 11, 2013, in 8 pages.
W. Zhang et al., "Advanced noise reduction techniques for ultra-low phase noise optical-to-microwave division with femtosecond fiber combs," IEEE Transactions on Ultrasonics, Ferroelectrics, and Frequency Control, vol. 52, Issue 5, May 2011, in 16 pages.
P. Ghelfi et al., "A fully photonics-based coherent radar system," Nature, vol. 507, Mar. 20, 2014, pp. 341-345.
J. Hall et al, Merging the Ultrasensitive, the Ultrastable, and the Ultrafast; A new Era of Frequency Standards and Optical Frequency Measurement, Optics and Photonics News, pp. 44-50, Feb. 2001.
Ishizawa et al., "Generation of 120-fs laser pulses at 1-GHz repetition rate derived from continuous wave laser diode," Optics Express, vol. 19, No. 23, Nov. 7, 2011, in 8 pages.
Kuse et al., "Full stabilization of an electro-optic comb to a mode-locked fiber comb," Optical Fiber Communications Conference and Exhibition (OFC) Mar. 20-24, 2016, in 3 pages.
Kuse et al., "Low noise electro-optic comb generation by fully stabilizing to a mode-locked fiber comb," Optics Express, vol. 24, No. 15, Jul. 25, 2016, in 10 pages.
Li et al., "Electro-optical frequency division and stable microwave synthesis," Science Express, Jun. 19, 2014, in 8 pages.
Shen et al., "Analysis and Demonstration of a Fast Tunable Fiber-Ring-Based Optical Frequency Comb Generator," Journal of Lightwave Technology, vol. 25, No. 11 Nov. 2007, pp. 3257-3264.
International Preliminary Report on Patentability in corresponding International Patent Application No. PCT/US2016/025527, dated Oct. 19, 2017, in 14 pages.

SYSTEMS AND METHODS FOR LOW NOISE FREQUENCY MULTIPLICATION, DIVISION, AND SYNCHRONIZATION

CROSS-REFERENCE TO RELATED APPLICATIONS

This application is a continuation of international application no. PCT/US2016/025527, filed Apr. 1, 2016, entitled "SYSTEMS AND METHODS FOR LOW NOISE FREQUENCY MULTIPLICATION, DIVISION, AND SYNCHRONIZATION," which claims the benefit of priority to U.S. Provisional Application No. 62/144,736, filed Apr. 8, 2015, entitled "SYSTEMS AND METHODS FOR LOW NOISE FREQUENCY MULTIPLICATION, DIVISION, AND SYNCHRONIZATION", U.S. Provisional Application No. 62/219,868, filed Sep. 17, 2015, entitled "SYSTEMS AND METHODS FOR LOW NOISE FREQUENCY MULTIPLICATION, DIVISION, AND SYNCHRONIZATION", and U.S. Provisional Application No. 62/299,239, filed Feb. 24, 2016, entitled "SYSTEMS AND METHODS FOR LOW NOISE FREQUENCY MULTIPLICATION, DIVISION, AND SYNCHRONIZATION"; all of the foregoing applications are expressly incorporated by reference herein in their entireties.

BACKGROUND

The disclosure relates to systems and methods for manipulation of electro-magnetic frequencies using photonic oscillators as frequency references.

DESCRIPTION OF THE RELATED ART

Low noise frequency division, multiplication and synchronization is useful for many applications of microwave technology. Especially frequency multiplication using conventional electronic means is generally associated with a large increase in phase noise proportional to the square of the multiplication factor that severely impedes the use of frequency references at low radio-frequencies (RF) for high frequency RF or microwave generation. Other challenges exist.

SUMMARY

Examples of low phase noise radio frequency (RF) sources generated by voltage controlled oscillators (VCOs) are described. In certain implementations, optical modulators driven by a VCO are used to generate optical side-bands to cw lasers. The spectral extent of said side-bands can be increased via frequency broadening in highly nonlinear waveguides. Free running mode locked low phase noise comb oscillators can then be used as reference oscillators to generate beat signals between those side-bands and individual comb modes at distal spectral regions, thereby creating an error signal that can be used to reduce the phase noise of VCOs and the generation of low phase noise RF signals.

In certain implementations, the free-running modelocked comb lasers can be phase locked to external frequency references allowing for further reduction of the phase noise of the VCOs at small offsets of the RF frequency carrier.

In other implementations, a reference comb can be omitted and a nonlinear interferometer can be used for the generation of an error signal that can be used for phase noise reduction of the VCO.

In yet other implementations the repetition rate of a slave comb can be locked to the modulation frequency of an intra-cavity modulator driven by a VCO. Comparison of the comb lines of that slave comb to a master comb or a cw reference laser can be used for the generation of an error signal that can be used for phase noise reduction of the VCO.

Additionally, examples are described of low phase noise RF generation from controllable microwave generators, for example voltage controlled oscillators (VCOs). Mode locked laser frequency combs, which may be operated as free-running, are utilized as low noise frequency references. Individual comb frequencies are compared with outputs from a VCO driven RF modulated cw laser. The beat signal generated from the RF modulated cw laser with individual comb frequencies can then be used for feedback to reduce the noise of the VCO in the RF domain, particularly for high frequency offsets from the RF carrier frequency. The cw laser and the frequency comb can have widely different optical carrier frequencies.

For low frequency offsets from the RF carrier frequency, RF noise reduction can be improved by locking the reference frequency comb to an external ultra-low noise frequency reference and generating a beat signal, which is independent of the repetition rate of the frequency comb. Alternatively, two cw reference lasers can also be used and the reference comb locked to the two cw reference lasers. Transfer oscillators can further be used to improve the signal-to-noise (S/N) ratio in the detection of the beat signals.

In another implementation, the mode locked comb laser reference can be replaced with a microcomb configured for broadband continuum generation. Comparison of the comb modes from the microcomb with the higher-order side-bands from a VCO driven modulated cw laser and the generation of appropriate beat signals can then be used for feedback to reduce the noise of the VCO in the RF domain. Both the microcomb generated comb spectrum and the side-band spectrum due to the modulated cw laser can be seeded by the same cw laser.

In yet another implementation, two cw lasers can be locked to a reference frequency comb and both cw lasers can be modulated via a VCO driven modulator to generate side-bands and the beat signal between two higher-order side-bands can be observed and used for phase noise reduction of the VCO. Alternatively, instead of using two cw lasers, two comb modes can be directly filtered out from the comb spectrum with two narrow bandpass optical filters and modulated via a VCO driven modulator.

A reference comb can further be eliminated from schemes for low phase noise RF generation by generation of a broad supercontinuum spectrum from a VCO-driven frequency modulated cw laser. Provided the cw laser or one of its side-bands is locked to a stable reference, a nonlinear interferometer can be used to observe a beat signal which is sensitive to the phase noise of the VCO and be used for phase noise reduction.

Any of these system can be used for the generation of low phase noise microwave signals with frequencies greater than about 25 GHz and up to about 1000 GHz.

Alternatively or additionally, the repetition rate of a first low phase noise frequency comb can be locked to a VCO and beat signals between individual comb frequencies and cw laser references used for VCO noise reduction. Instead of cw reference lasers, a second low phase noise frequency comb can be used as a reference. The first low phase noise frequency comb can be based on passively mode locked, actively mode locked or harmonically mode locked lasers.

Also a harmonic(s) of the repetition rate of the first low phase noise laser can be locked to the VCO, allowing for low phase noise frequency multiplication.

Additionally or alternatively low phase noise RF frequencies can be generated directly via frequency division in a photo-diode.

Any of the systems and methods described herein may be compatible with any low phase noise frequency comb laser and can be implemented for example with low phase noise fiber, solid-state or diode lasers. In terms of integration and low cost, low phase noise fiber lasers operating near the zero dispersion point are particularly attractive. Such low phase noise fiber lasers can be constructed in an all polarization maintaining form using for example intra-cavity nonlinear Sagnac loop mirrors. Mode locked fiber lasers based on any rare-earth dopant can be constructed, such as Nd, Yb, Er, Tm, Ho, Dy or combinations thereof. Graphene modulators can be further used to reduce the phase noise of frequency comb lasers.

As another implementation, two different frequency comb lasers can be synchronized to each other using beat signals between individual comb frequencies.

In a first aspect, a low phase noise RF signal is generated via phase noise reduction of a VCO via comparison of the higher-order frequency side bands of a cw laser modulated at the VCO oscillation frequency with a low phase noise comb reference laser.

In a second aspect, a highly integrated opto-electronic arrangement for the generation of low phase noise RF signals is shown.

In a third aspect, optimum configurations for ultra-low phase noise fiber comb lasers are disclosed.

In a fourth aspect, a low phase noise RF signal is generated via phase noise reduction of a VCO via comparison of the higher-order frequency side bands from two cw lasers modulated at the VCO oscillation frequency. Both cw lasers are further phase locked to a low phase noise comb reference laser.

In a fifth aspect, a low phase noise RF signal is generated via phase noise reduction of a VCO via comparison of the higher-order frequency side bands from two comb modes filtered out from a reference comb laser via two narrow bandpass optical filters, where the frequency side bands are generated with a VCO driven optical modulator.

In a sixth aspect a low phase noise RF signal is generated via frequency broadening of a VCO driven phase modulated cw laser and a nonlinear interferometer configured to observe beats between two distal higher-order side bands of the broadened spectrum and using that beat signal for phase noise reduction of the VCO. In this the cw laser frequency is further locked to a stable cw reference laser or optical clock.

In a seventh aspect, a low phase noise RF signal is generated via phase noise reduction of a VCO via comparison of the comb modes of two comb lasers operated in a master slave configuration, where the slave comb is further phase-locked to a VCO modulation frequency or a sub-harmonic of it.

By way of example, in certain embodiment's of the present disclosure low phase noise may be characterized as a value of single side-band phase noise lower than being available from conventional RF oscillators of a certain grade. In some implementations a single side-band RF phase noise lower than achievable from any conventional RF oscillator can be obtained. In some implementations the utilization of all polarization maintaining fiber combs leads to such advancement. For example, low phase noise includes a single-side band phase noise density for a 10 GHz carrier of less than −140 dBc/Hz, where dBc is decibels relative to the carrier, at a frequency offset of 100 kHz. As will be further discussed below, values of −132, −152, −162, and −172 dBc/Hz are representative of low phase noise at 25 GHz. By way of example the noise may be in the range from about −120 dBc/Hz to −220 dBc/Hz at a frequency offset of 100 kHz.

The foregoing and other aspects will be described with reference to the figures and the following detailed description. This Summary is not intended to limit the scope of the disclosure but instead is intended to illustrate various aspects of the following detailed description.

Figure 1:
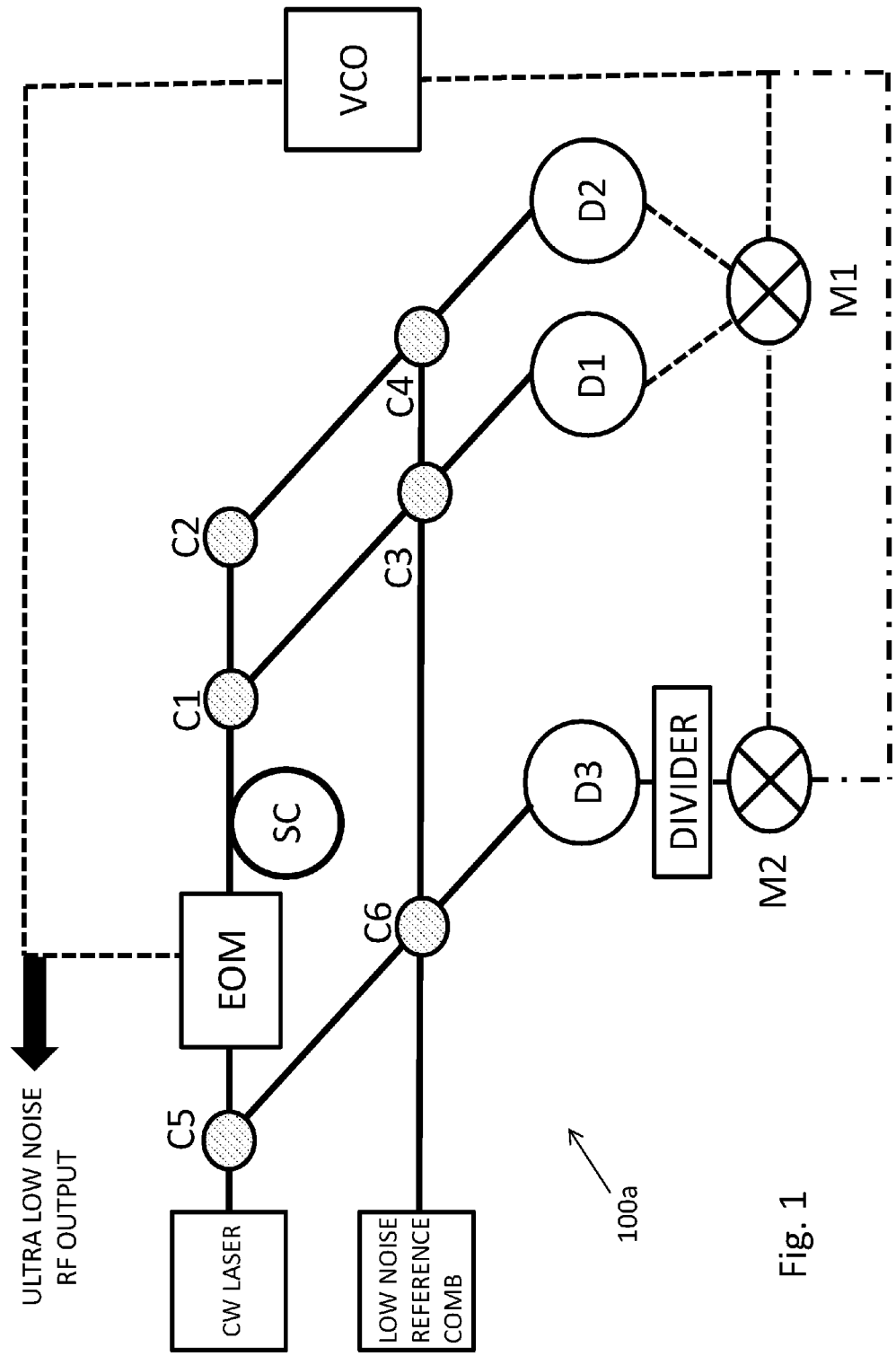
FIG. 1 schematically illustrates an example arrangement for phase noise reduction of a voltage controlled oscillator (VCO) using a comb laser as a frequency reference.

Additional figures schematically illustrating additional embodiments of the disclosure are included in the various patents, patent publications, and patent applications incorporated by reference herein. The figures depict various embodiments of the present disclosure for purposes of illustration and are not intended to be limiting. Alternative embodiments of the systems and methods illustrated herein may be employed without departing from the principles described herein. Reference will now be made in detail to several embodiments, examples of which are illustrated in the accompanying figures. It is noted that wherever practicable similar or like reference numbers may be used in the figures and may indicate similar or like functionality.

DETAILED DESCRIPTION

Overview

To overcome one or more disadvantages associated with increasing phase noise with increasing RF frequencies, it may be useful to use frequency standards in the optical domain and to then generate RF frequencies via frequency division, which can theoretically produce a reduction in phase noise proportional to the square of the division factor. To enable low noise frequency division from the optical to the RF domain, low noise frequency combs are highly beneficial, as for example described in J. Hall and J. Ye, 'Merging the Ultrasensitive, the Ultrastable, and the Ultrafast; A new Era of Frequency Standards and Optical Frequency Measurement', Optics and Photonics New, pp. 44, February 2001. Low phase noise RF generation from frequency combs was subsequently also discussed in U.S. Pat. No. 7,026,594 to Holzwarth et al.

As an alternative to frequency combs, low phase noise RF generation was also described based on resonators operating in the optical domain using opto-electronic oscillators (OEOs) in U.S. Pat. No. 6,567,436. OEOs were also described in U.S. Pat. No. 5,723,856. Another alternative is to generate a low phase noise RF signal from a voltage controlled oscillator (VCO) via an external interferometer that is sensitive to the frequency difference of the VCO and the repetition rate of a low phase noise mode locked laser oscillator, as described in U.S. Pat. Nos. 7,393,567 and 7,593,644. Yet another method relies on the use of frequency modulation of two separate continuous wave (cw) laser references at a certain RF frequency and beating two higher-order modulation side-bands, as described in J. Li et al., 'Electro-optical frequency division and stable microwave synthesis', Science Express, June 2014. The method described in J. Li et al., further benefits from generation of two cw reference lasers from a single ultra-stable optical cavity to suppress any common mode frequency noise. Frequency broadening of modulated cw lasers can be done very efficiently as described for example in A. Ishizawa et al., 'Generation of 120-fs laser pulses at 1-GHz repetition rate derived from continuous wave laser diode', Opt. Expr., 19, 22402 (2011) and Japanese patent applications, JP2014135341A, 'Optical frequency comb stabilization light source and method' to A. Ishizawa et al. and JP2013120202A, 'Device and method for generating pulse light' also to A. Ishizawa et al.

A particularly simple method for low phase noise RF generation relies on simple frequency filtering of two modes from a mode locked oscillator and detecting their beat signal with an optical detector, as for example described in P. Ghelfi et al., 'A fully photonics-based coherent radar system', Nature, vol. 507, pp. 341 (2014).

Many demonstrated methods suffer from a variety of shortcomings. For example low phase noise RF generation directly from photo detectors as described in Hall et al. requires the use of photodiodes with high saturation current to overcome shot noise and the generated RF signals are further sensitive to flicker noise in the photodiodes. Other methods are relatively complex or produce relatively high RF noise floors and thus produce only a small improvement compared to conventional low phase noise RF oscillators. Various embodiments disclosed herein can overcome some or all of these or other shortcomings.

Figure 2:
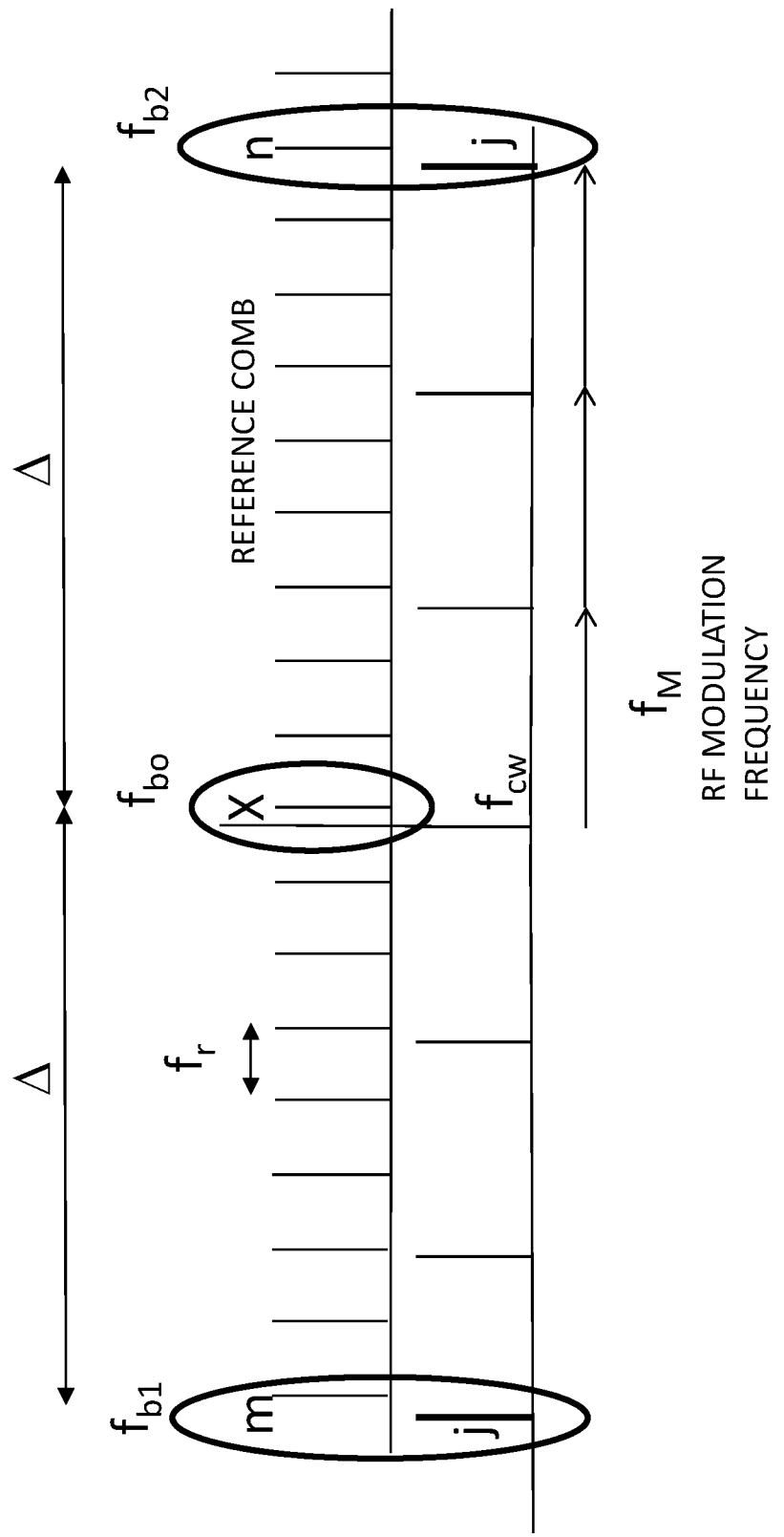
FIG. 2 schematically illustrates an example of the comb modes involved in phase noise reduction of a VCO via a comb reference laser.

Example Systems and Methods for Low Noise Frequency Multiplication, Division, and Synchronization Various embodiments of sources $100a$-$100f$ of low phase noise microwave frequencies will be described. FIG. 1 shows an example of a low phase noise RF source $100a$ based on a passively mode locked comb laser. A low noise reference comb provides a stable comb reference spectrum (reference comb) which can be characterized by comb modes $f_n = f_o + n \times f_r$, where $f_o$ is the carrier envelope offset frequency and $f_r$ is the laser repetition rate. The individual modes of an example reference comb are depicted in FIG. 2. The reference comb repetition rate $f_r$ can further be stabilized by locking one of the reference comb lines to a first cw laser with frequency $f_{cw}$, which can in turn be frequency stabilized by locking its frequency to an external reference cavity or an optical clock transition. To lock the reference comb to a cw laser, for example, a beat signal $f_{b0}$ between one comb line and the cw laser can be stabilized to an external RF frequency reference. If only one reference cw laser is used, it is useful to subtract the carrier envelope offset frequency $f_0$ electronically from $f_{b0}$. The carrier envelope offset frequency can for example be generated using an f-2f interferometer downstream from the low noise reference comb and further providing an octave spanning frequency comb via for example frequency broadening of the comb in a supercontinuum fiber (SC). Any optical elements implemented for supercontinuum generation or the construction of an f-2f interferometer for the ultra-low noise reference comb are not separately shown in FIG. 1. By way of example, several such arrangements are disclosed in U.S. Pat. No. 7,649,915, entitled "Pulsed laser sources", which is hereby incorporated by reference herein in its entirety for all it discloses.

Referring back to FIG. 1, a second cw laser can be further provided, which can be identical to the first cw laser. It is assumed in the following that only one cw laser is used. As an alternative to an external cw laser, also a comb line can be filtered out from the comb spectrum via a narrow bandpass optical filter and appropriately amplified. Such an implementation is not separately shown.

The cw laser (or isolated comb mode) can be phase or amplitude modulated at an RF modulation frequency $f_M$ via a modulator (EOM) driven by a VCO. Any type of modulator can be used for example electro-optic, absorption or graphene based modulators can be implemented. Also cascaded modulators can be implemented. Particularly useful is the use of cascaded phase modulators in conjunction with an amplitude modulator, as for example described in A. Ishizawa et al., 'Generation of 120-fs laser pulses at 1-GHz repetition rate derived from continuous wave laser diode', Opt. Expr., 19, 22402 (2011). Cascading of phase modulators increases the strength of the modulation side bands as well as their spectral coverage, whereas an amplitude modulation in synchronism to the phase modulators can be used to reduce the repetition rate of the generated pulse form, which is valuable to reduce the average power requirements for spectral broadening or supercontinuum generation subsequent to the phase modulation stage. Cascaded phase/amplitude modulators are not separately shown here.

With appropriate amplification of the cw laser and injection into a nonlinear waveguide, such as a highly nonlinear fiber, frequency side-bands to the cw laser in the optical frequency domain separated by $\pm j \times f_M$ (j=integer) from the frequency $f_{cw}$ of the cw laser are generated. To generate an ultra-low noise RF signal at $f_M$, beat signals $f_{b1}$ and $f_{b2}$ as shown in FIG. 2 are detected with detectors D1 and D2 respectively, where $$f_{b1} = (x-\Delta)f_r + f_0 - (f_{cw} - jf_M) \qquad (1)$$

$$f_{b2} = (x+\Delta)f_r + f_0 - (f_{cw} + jf_M). \qquad (2)$$

Here x, $\Delta$ and j are integers and $xf_r$ is the comb mode closest to the frequency of the cw laser. It is assumed that comb lines of equal order are compared, though this is not a requirement.

If $f_{b1}$ and $f_{b2}$ are input to mixer M, a beat signal $F_b$ is generated:

$$F_b = f_{b1} - f_{b2} = 2(jf_M - \Delta f_r). \qquad (3)$$

As an example and with reference to FIG. 1, a mixer M1 can be configured as a double balanced mixer. By comparing $F_b$ to an external RF reference signal, an error signal for stabilization of $f_M$ can be provided. The frequency comb can be free running, e.g., $f_r$ or $f_0$ do not need to be stabilized to produce a substantial reduction in phase noise for $f_M$, especially for a large frequency offset from an RF carrier frequency. The phase noise of $f_M$ can be reduced by an order of $(2j)^2$, e.g., the phase noise of the reference comb can be directly transferred to the VCO. This can be seen when looking at the phase noise amplitude $\varphi_m$ at the modulation frequency $f_M$; from eq. (3) it follows that $$\varphi_m = \varphi_{ref}/2j + \varphi_r \times (f_M/f_r), \qquad (4)$$

where $\varphi_r$ is the phase noise amplitude at the repetition frequency of the comb reference and $\varphi_{ref}$ is the phase noise amplitude of the (low frequency) RF reference signal that $F_b$ is locked to. The phase noise amplitude $\varphi_{ref}$ gets reduced by the factor of 2j corresponding to a reduction in phase noise power by $(2j)^2$. The phase noise $\varphi_r$ of the reference comb gets amplified by the factor $(f_M/f_r)$, but this is due to the frequency ratio of $f_M$ over $f_r$. To first order, no additional penalty in phase noise for $f_M$ is incurred.

For example when generating an RF carrier at 10 GHz, the above method can produce useful RF phase noise reduction for frequency offsets≥1 kHz from the RF carrier. An example optical arrangement to provide the various beat signals is also shown in FIG. 1, where the supercontinuum stage downstream from the cw reference laser is referred to as SC, and couplers C1-C4 are used to isolate the beat signals. Optical links are depicted with full solid lines and electrical links with dashed lines. In this implementation, couplers C5, C6, detector D3 and mixer M2 as well as the frequency divider (divider) shown in FIG. 1 are not used.

One possible limitation of the RF phase noise reduction scheme as expressed by eq. (3) is the dependence of $F_b$ on $f_r$ of the comb reference laser which may, in some cases, limit the reduction in phase noise for $f_M$, especially for small frequency offsets from an RF carrier, for example for frequency offsets in the range from about 0.01 Hz to about 100 kHz. A way around this potential limitation is to use a stable cw reference frequency $f_{cw}$ and stabilize the repetition rate of the comb laser via the beat signal $f_{b0} = f_{cw} - xf_r$, where it is already assumed that $f_0$ is electronically subtracted from $f_{b0}$. The repetition rate of a comb laser can for example be stabilized via the use of a graphene or electro-optic modulator as for example disclosed in U.S. provisional application No. 62/053,401, Sep. 22, 2014, 'Low Carrier Phase Noise Fiber Oscillators' to Fermann et al. as well as U.S. provisional application No. 62/093,889, filed Dec. 18, 2014, 'Low Carrier Phase Noise Fiber Oscillators' also to Fermann et al., Tow Carrier Phase Noise Fiber Oscillators' to Fermann et al.

The system can then multiply $f_{b0}$ electronically with a ratio R=(2$\Delta$/x) using for example a digital divider. Mixing of $F_b$ with $f_{b0}' = f_{b0} \times (2\Delta/x)$ produces a signal $$(F_b - f_{bo}') = (2j)f_M - f_{cw}(2\Delta/x) \qquad (5)$$

which is not dependent on $f_r$ any more. By comparing $F_b - f_{b0}'$ to an external RF reference signal, an error signal for stabilization of $f_M$ can be provided. Hence a reduction in phase noise for $f_M$ can be achieved at low frequency offsets from an RF carrier frequency. Even using a ratio close to 2$\Delta$/x already reduces the phase noise of $(F_b - f_{bo}')$. Assuming a comb laser with comb spacing of 400 MHz, an optical frequency of 1.56 μm corresponds to x=480,000. The ratio R=1/20 thus corresponds to $\Delta$=12,000 and an optical separation of around 80 nm between the comb modes of order (x−$\Delta$) and (x+$\Delta$). Hence broadening of the cw laser to only a fraction of an octave can be used for the subtraction of the phase noise from repetition rate fluctuations; with optimum use of phase and amplitude modulators, even octave spanning supercontinuum spectra can be generated via modulation of cw lasers and nonlinear spectral broadening in highly nonlinear fibers. Any form of nonlinear waveguide can be used, e.g., highly nonlinear fibers, nonlinear waveguides based on silicon, silica nitride, semiconductors and other materials. The comb lines of the cw reference comb can further be stabilized via locking of two individual comb lines to two cw reference lasers or using just one cw reference laser and stabilization of the comb carrier envelope offset frequency.

An example optical arrangement to provide the various beat signals is also shown in FIG. 1, where couplers C5 and C6 are used to isolated the $f_{b0}$ beat signal and detector D3 is used to detect it. The additional double balanced mixer is M2 and the additional electrical links for this arrangement are depicted with dashed-dotted lines.

To enhance the S/N ratio of $f_{b1}$ and $f_{b2}$ it is further useful to implement cw transfer oscillators. With reference to FIG. 2, the optical frequencies of the cw transfer oscillators can be selected to be approximately in the range encircled by the two ellipses (near the frequencies $f_{b1}$ and $f_{b2}$). Note that the transfer oscillators do not need to have ultra-narrow linewidths as their frequency noise is cancelled out in the detection of the $f_{b1}$ and $f_{b2}$ beat signals.

In the above discussion of certain arrangements, phase noise reduction of the VCO was achieved via comparison of the lines of a comb system on both spectral sides of a frequency modulated cw laser. However, in general, the phase noise of the VCO can also be reduced via comparison of a comb line with only one spectral side band of a frequency modulated cw laser. With reference to FIG. 2, assuming for example that the cw laser is locked to one of the comb lines via beat signal $f_{b0}$, the beat signals $(f_{b1}-f_{b0})$ or $(f_{b2}-f_{b0})$ on their own already contain the amplified phase noise of the VCO and can be used to reduce it. Alternatively, the cw laser can be locked to an external frequency reference and the comb locked to the same cw laser or a different cw laser and beat signals $(f_{b1}-f_{b0})$ or $(f_{b2}-f_{b0})$ or $f_{b1}$ and $f_{b2}$ on their own can be used for phase noise reduction of the VCO. Control or subtraction of the carrier envelope offset frequency can also be included where required. Also, the cw laser can be located in a different spectral region than the frequency comb. For example the cw laser could be located in the spectral region of around 1.56 μm and the frequency comb could be centered around a the spectral region around 1.9 μm. Spectral broadening of the frequency comb and the cw laser can then ensure spectral overlap between the two sources in a wide wavelength range. Other possibilities exist.

A possible limitation with some arrangements discussed above is the requirement for a stable cw laser which can also be referenced to an ultra-stable cavity or optical clock. The phase noise of the ultra-stable cw laser is then transferred to the RF frequency. However, since the phase noise of ultra-stable cw lasers can be very small at low frequencies, this method is particularly useful for the generation of RF frequencies with low phase noise close to the RF carrier frequency. Cw lasers stabilized to ultra-stable cavities can be produced in an ultra-small form factor using micro-cavities as for example described in J. Li et al., 'Electro-optical frequency division and stable microwave synthesis', Science Express, June 2014.

Another simplification can be obtained by using micro-combs as the reference comb. Any optical system producing microcombs can be used, for example, high Q resonators constructed from silicon, silica nitride, silica or whispering gallery mode waveguides. An example of micro-combs that can be utilized with various arrangements disclosed herein was described in U.S. Pat. No. 7,982,944 'Method and apparatus for optical frequency comb generation using a monolithic micro-resonator' to Kippenberg.

In addition to using micro-combs for the comb reference laser, the cw laser in conjunction with the modulator and frequency broadening can also be based on an integrated optic design architecture; thus the whole system construction can be highly integratable.

Figure 3:
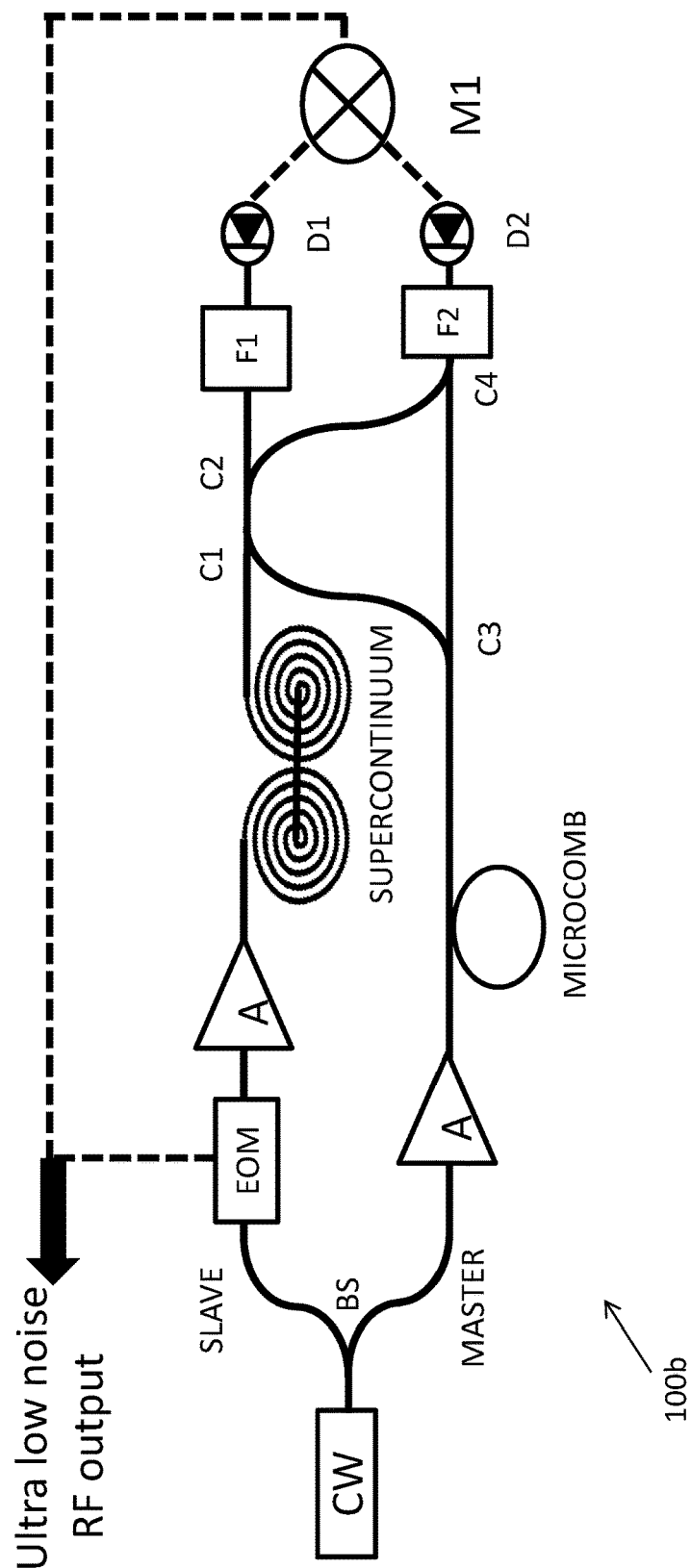
FIG. 3 schematically illustrates an example of a highly integrated arrangement for low phase noise RF frequency generation.

An example of such a highly integrated low phase noise RF source 100b is shown in FIG. 3. A first cw laser is provided, which can further be locked to a reference cavity or an optical clock. The output of the cw laser is further split into two parts via splitter BS; e.g., a slave and a master system. The master system comprises a micro-comb resonator which is seeded by the cw laser and is configured to generate a broadband continuum. The micro-comb master can have a fundamental resonance frequency less than 10 GHz and in some implementations, a resonance frequency less than 1 GHz to reduce its phase noise. The micro-comb carrier envelope offset frequency can further be locked via an f-2f or 2f-3f interferometer or via stabilizing one of the comb lines with respect to a second cw laser, which can also be locked to an optical clock. The power of the first cw laser can be used for carrier envelope offset frequency control of microcombs.

The slave system comprises a modulator arrangement (EOM) configured to generate side-bands to the cw laser at the modulation frequency, which is provided by a VCO (not shown in FIG. 3). The spectral extent of the spectral sidebands is further broadened in the supercontinuum stage which can be constructed from highly nonlinear waveguides and can also comprise spirally coiled nonlinear waveguides. Appropriate optical amplifiers can also be included in the slave and master arm.

Couplers C1, C2, C3 and C4 combine the spectral output from the master and slave and generate output at two distal spectral regions. Optical bandpass filters F1 and F2 can be selected to further narrow down the bandwidth of these two distal spectral regions, where interference of comb lines from the master and slave produce two beat signals $f_{b1}$ and $f_{b2}$, which are further mixed with mixer M1 and used to generate an error signal for the control of the electro-optic modulator (EOM) modulation frequency via the VCO, similar to what was already discussed with respect to FIG. 1. Transfer oscillators (not shown) can further be used in the two distal spectral regions to increase the S/N ratio of the two beat signals. Though here an arrangement using two beat signals is shown, when using a stable cw laser reference, this is not required, e.g., phase noise reduction of the RF frequency output can be obtained from the beat signal between comb and master in only one spectral side band region, as this beat signal already contains the phase noise from the VCO.

The use of highly reliable reference combs facilitates implementation of low phase noise RF sources. In addition to micro-combs, low phase noise comb sources based on solid-state, or fiber or diode lasers can be conveniently used. An example of a low phase noise fiber comb laser was for example described in PCT Patent Application No. PCT/US2014/063822, filed Nov. 4, 2014, 'Compact Fiber Short Pulse Laser Sources' to Fermann et al. ("'822"), U.S. Provisional Application No. 62/053,401, Sep. 22, 2014, 'Low Carrier Phase Noise Fiber Oscillators' to Fermann et al., U.S. Provisional Application No. 62/093,889, filed Dec. 18, 2014, 'Low Carrier Phase Noise Fiber Oscillators' also to Fermann et al., and PCT Patent Application No. PCT/US2015/050362, Sep. 16, 2015, 'Low Carrier Phase Noise Fiber Oscillators' also to Fermann et al., each of which is hereby incorporated by reference herein in its entirety for all each discloses.

To achieve low phase noise from a comb laser, the comb laser can be operated near zero dispersion, as can be achieved via the insertion of appropriate amounts of positive and negative dispersion fiber, as disclosed in U.S. Pat. No. 7,649,915 to Fermann et al. An example of an appropriate fiber comb system 400 adapted from '822 is reproduced in FIG. 4. The system comprises a nonlinear amplifying loop mirror (NALM), as disclosed in '822 and further includes a non-reciprocal phase bias as already disclosed in U.S. Pat. No. 5,450,427 ("'427"), "Technique for the generation of optical pulses in modelocked lasers by dispersive control of the oscillation pulse width" to Fermann et al., which is hereby incorporated by reference in its entirety for all it discloses. A graphene modulator can be included on one side of the cavity for high bandwidth repetition rate or carrier envelope offset frequency control. The pump light is inserted into the NALM via an extra-cavity wavelength-division multiplexing (WDM) coupler and the x/(1−x) coupler, where x is typically in the range from 0.1-0.9. The gain fiber can be selected from any rare-earth fiber gain material. A single polarization state is selected with an intra-cavity polarizer. Pump power is provided via a laser diode or a cw fiber amplifier operating at an appropriate pump wavelength. All fiber inside the oscillator can be polarization maintaining, which also increases or maximizes long-term stability of the system. In some arrangements an all-fiber configuration may be implemented, with few if any bulk optical components.

Figure 4:
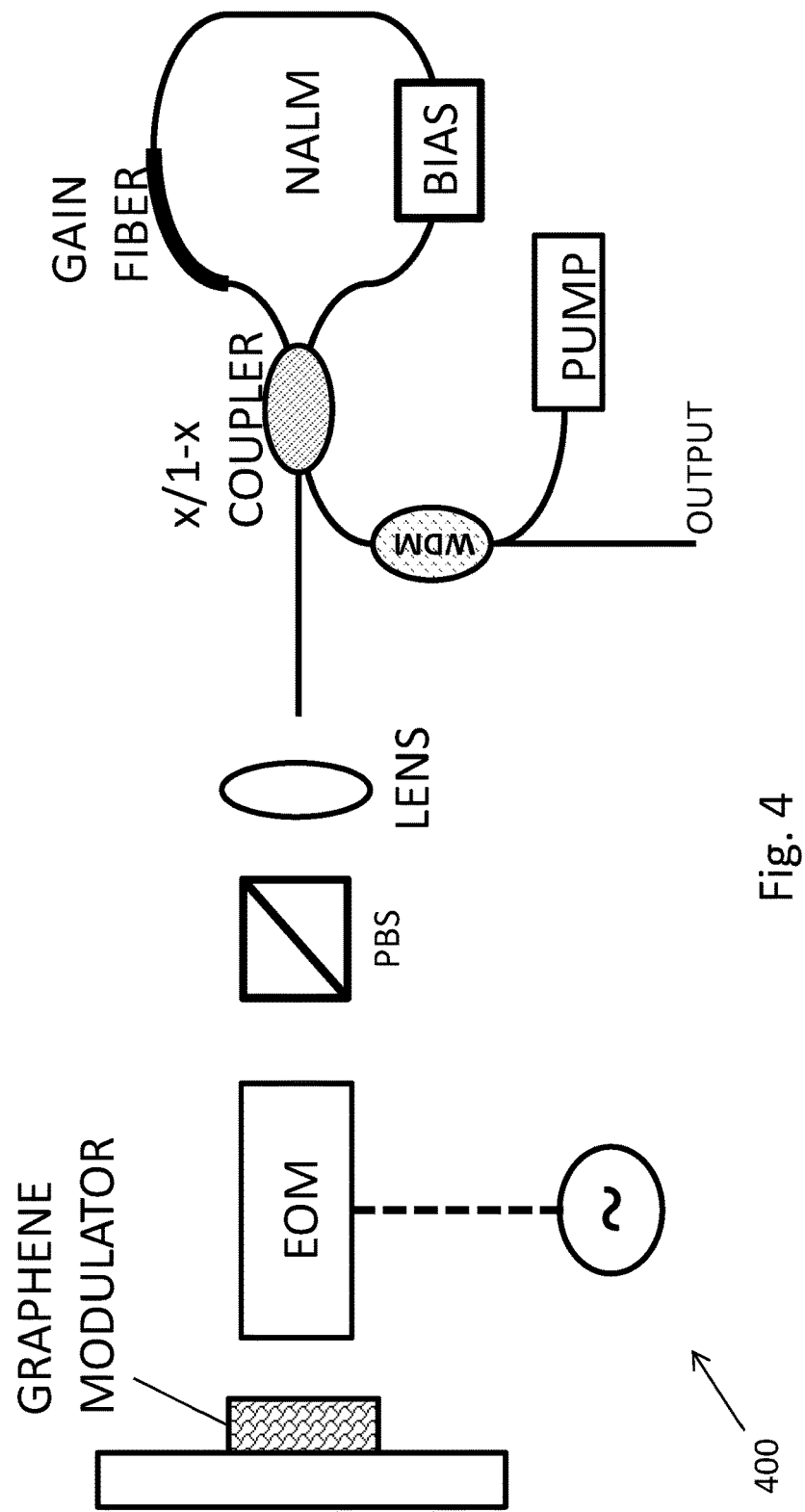
FIG. 4 schematically illustrates an example of a low phase noise fiber comb laser.

To initiate passive modelocking in the NALM, the pump power can be increased until self-starting operation is achieved and subsequently reduced to enable operation with one single pulse in the cavity. Alternatively, the EOM, acousto-optic modulator (AOM) or other suitable device can be modulated close to the repetition rate of the laser to initiate modelocking. Incorporation of the EOM further allows for high bandwidth repetition rate control which is advantageous for low phase noise RF generation. Additional piezoelectric transducers can be included for lower bandwidth repetition rate control. As discussed in '822, additional bulk or fiber components for dispersion control can also be included inside the cavity. Also, as discussed in '427, instead of a Fabry-Perot cavity as shown in FIG. 4, a figure eight (F8) configuration can be implemented. The EOM can then be conveniently based on an integrated $LiNbO_3$ modulator and located in the non-NALM part of the F8 laser.

Assuming (without requiring) Gordon-Haus jitter to be the main limiting factor for low phase noise comb operation, one can show that the achievable phase noise spectral density is proportional to $g(f_{rep})^2/(\Delta v^2 P)$, where g is the intra-cavity gain, $\Delta v$ is the oscillating pulse bandwidth, $f_{rep}$ is the comb laser pulse repetition rate and P is the average intra-cavity power. Thus for low phase noise operation, the NALM may be configured to allow for oscillation with broad bandwidth pulses and correspondingly minimal pulse widths at a maximum of intra-cavity power. Particularly advantageous, in some implementations, is an oscillating pulse full-width half-maximum (FWHM) bandwidth greater than 2.5 THz. At 1050 nm, 1560, 1950 nm, 2.5 THz bandwidth corresponds to 9.2 nm, 20.3 nm and 31.7 nm respectively. For Yb and Tm fiber lasers operating at 1050 and 1950 nm respectively, these bandwidths comprise only around 20% of the laser gain bandwidth and therefore for low phase noise operation Yb and Tm fiber lasers are particularly useful.

When using Yb fiber lasers the comb phase noise can further be reduced by incorporating large mode area fibers in the oscillator, e.g., fibers with fiber core diameters greater than 8 µm. When using Tm fiber lasers, comb phase noise can be minimized by implementing second and third dispersion compensation in the cavity via selection of appropriate fibers, as discussed previously in U.S. Pat. No. 8,787, 410 to Fermann. Also, the use of photonic crystal fibers with central air-holes can reduce the nonlinearity of the oscillators and maximize the intra-cavity power, thus minimizing phase noise.

Figure 5:
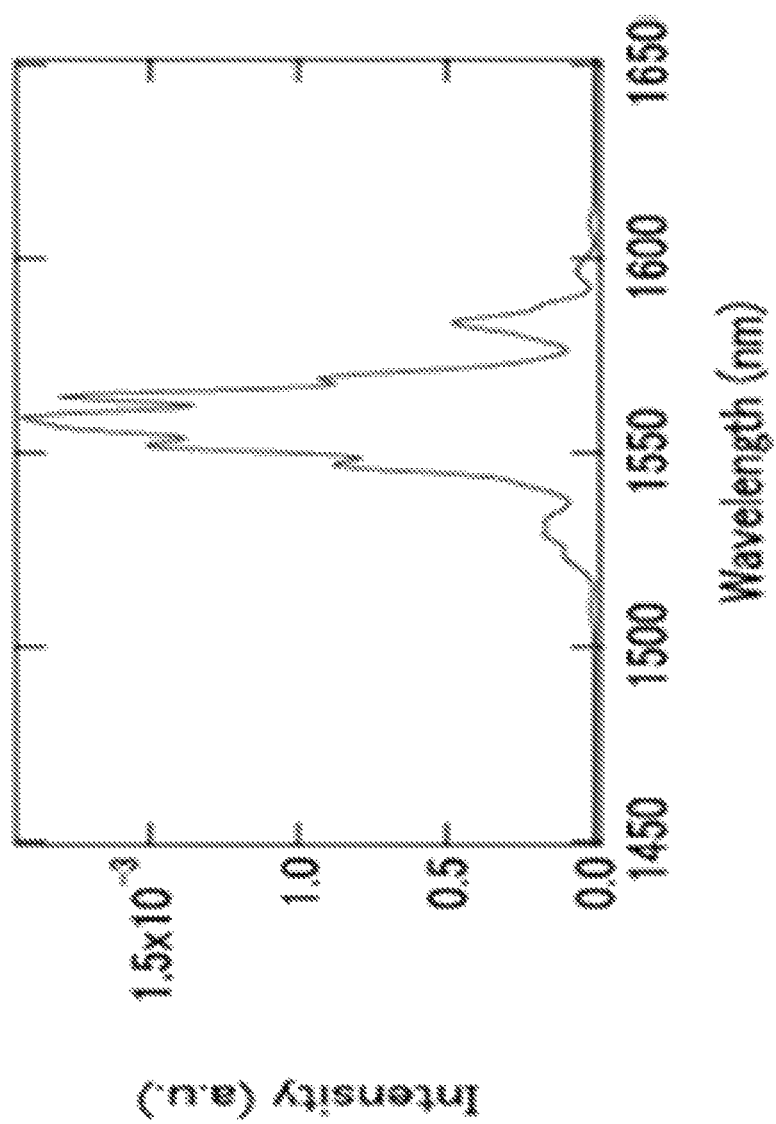
FIG. 5 is an example measurement of the oscillating optical spectrum within of a low phase noise fiber comb laser arrangement.
Figure 8:
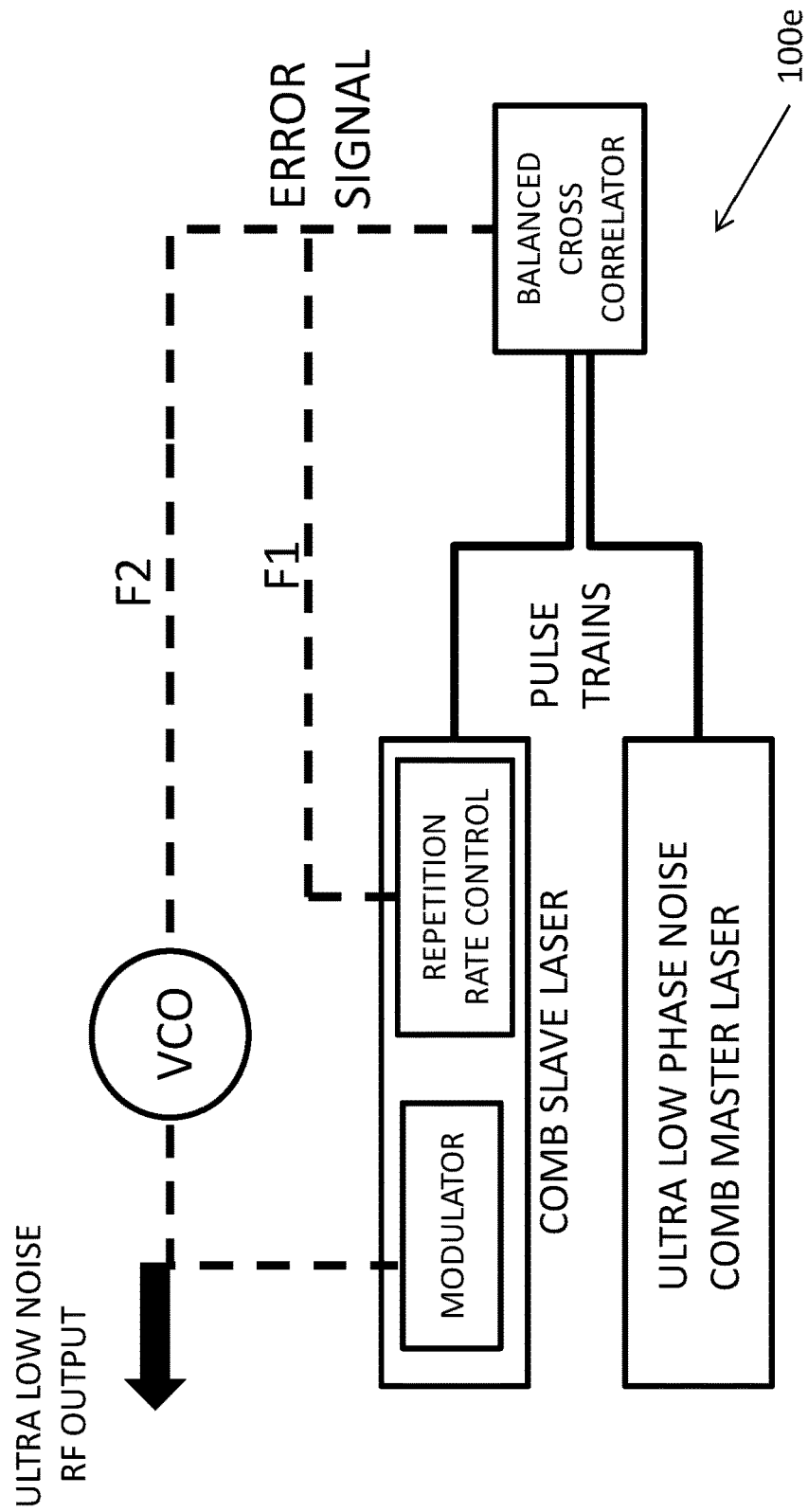
FIG. 8 schematically illustrates an example of phase noise reduction of a VCO using a master slave arrangement of two comb lasers.

An example of the intra-cavity spectrum generated with an Er-NALM laser operating near zero dispersion at a repetition rate of 70 MHz is shown in FIG. 5. Here all intra-cavity fiber was polarization maintaining. The oscillating pulse spectral width is about 25 nm and the estimated pulse timing jitter in a frequency range from 10 kHz to 35 MHz is less than 150 as. With larger oscillating bandwidths as for example achievable with repetition rates greater than 70 MHz and when using Yb and Tm as well as low dispersion Er fiber oscillators, a pulse timing jitter less than 100 as can be achieved. Even a pulse timing jitter less than 50 as and smaller than 10 as is possible. Fiber oscillators comprising all polarization maintaining fiber and producing a timing jitter less than 1000 as (=1 fs) are particularly useful for the generation of low phase noise RF signals. Timing jitter can be conveniently measured with a balanced cross correlator as for example disclosed in U.S. Pat. No. 7,940, 390, 'Compact background-free balanced cross-correlators' (see also the example systems shown in FIGS. 5b and 8 that can be used to measure timing jitter).

Figure 5A:
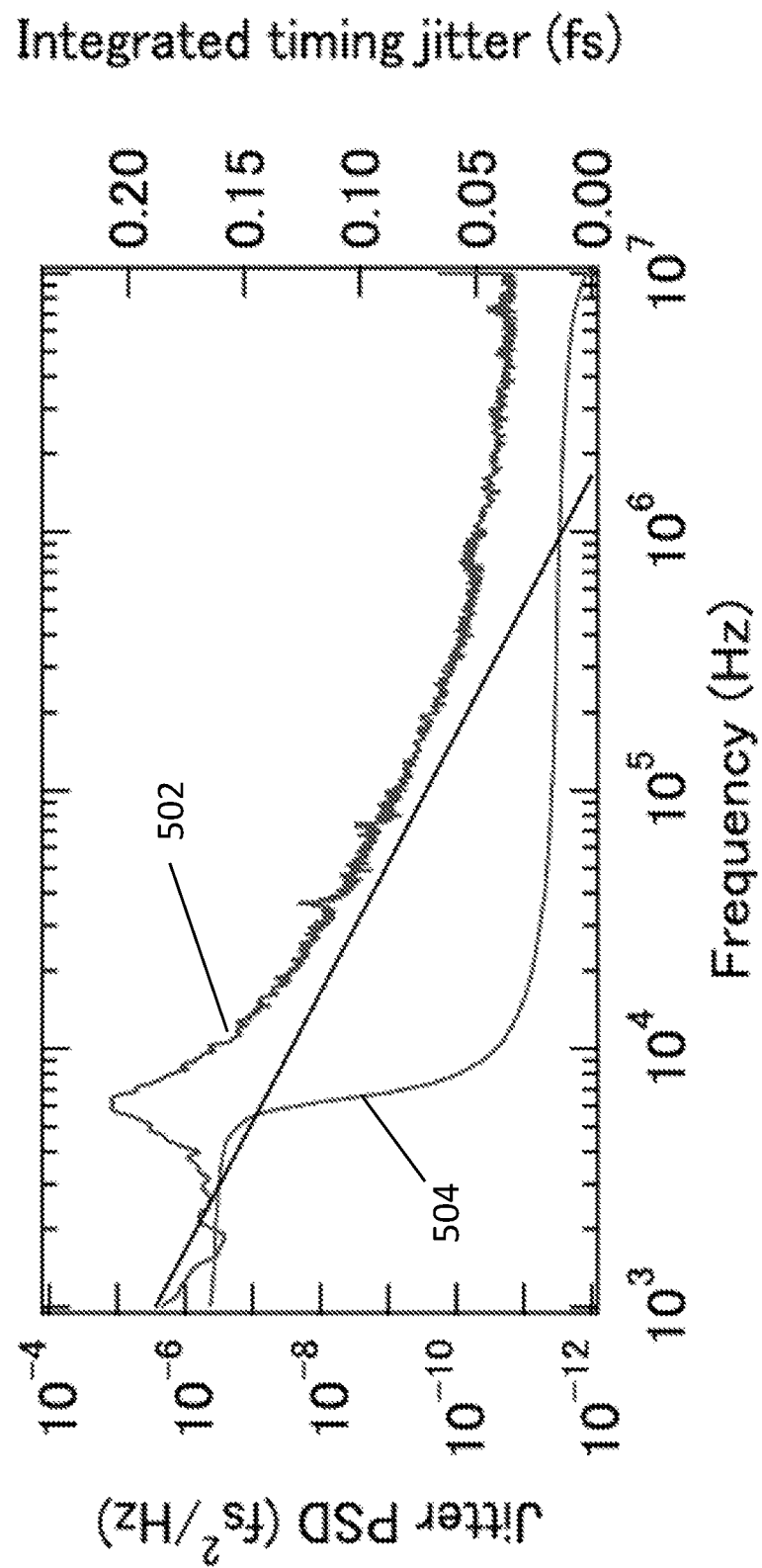
FIG. 5a is an example measurement of the timing jitter of an Er fiber comb laser obtained with a balanced cross correlator.
Figure 5B:
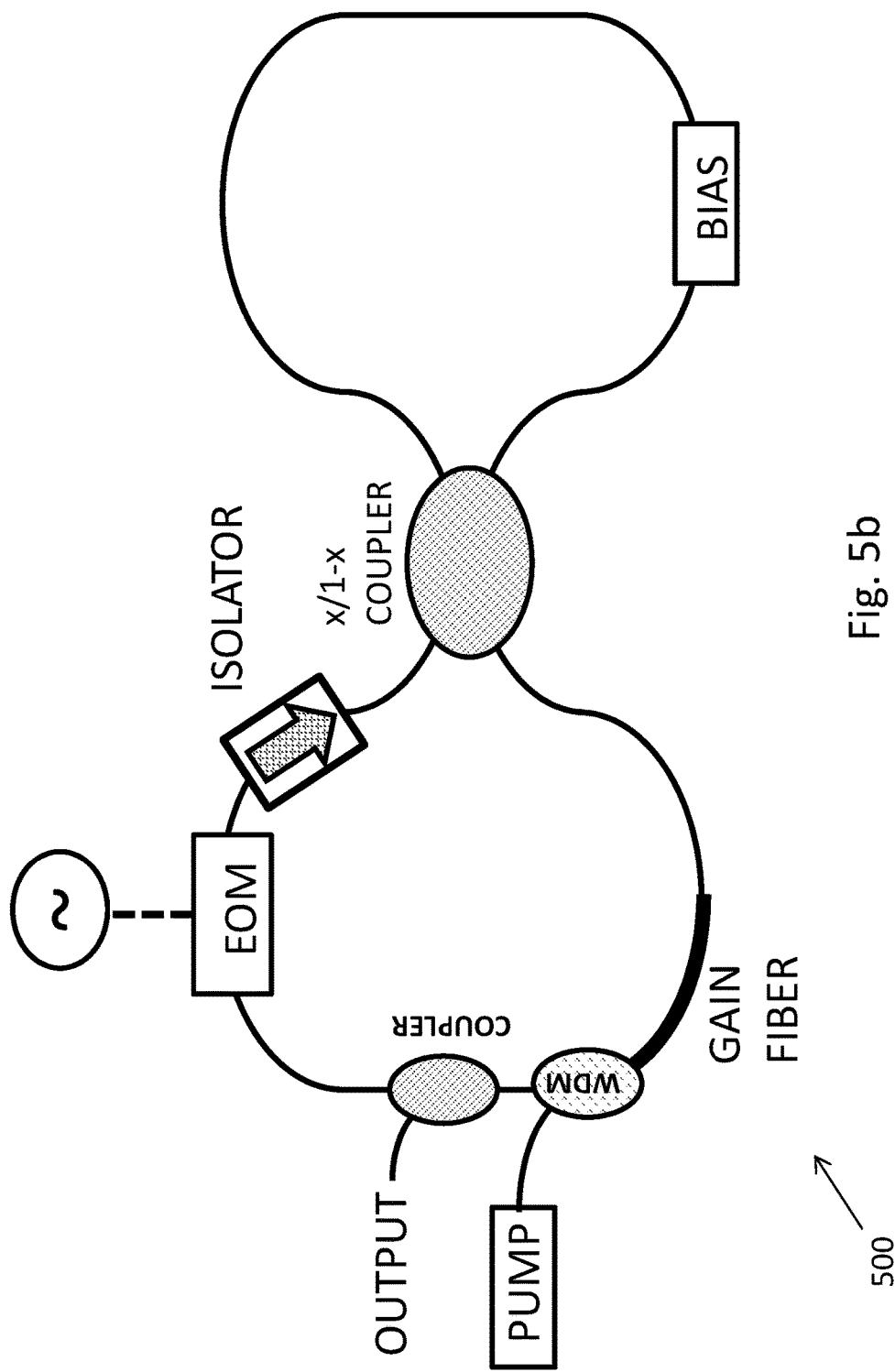
FIG. 5b is an example of a fiber comb constructed using a figure eight (F8) configuration.

An example of a cross correlator measurement of a low pulse timing jitter NALM system as shown in FIG. 4 is reproduced in FIG. 5a. Here the timing jitter power spectral density (PSD, as a function of frequency in Hz) is shown in $fs^2/Hz$ (left vertical axis and upper line 502) as well as the integrated timing jitter in fs (right vertical axis and lower line 504). The integrated timing jitter from 10 MHz to 10 kHz is only 40 attoseconds (as). Also shown is a theoretical timing jitter estimate (in fs, assuming minimal Gordon-Haus jitter and direct timing jitter) as a straight diagonal line as the main jitter source. The intra-cavity average power was measured as 50 mW at the intra-cavity lens with an additional beam splitter (not shown in FIG. 4). From the theoretical estimate it is clear that a timing jitter of less than 40 as is possible. In fact a timing jitter less than 10 as is possible by using a pump source with low relative intensity noise (RIN) (for example not greater than about 20 dB above shot noise at a frequency higher than about 100 kHz) and by further optimization of the intra-cavity power, for example, via the implementation of large core fibers or photonic crystal fibers. The intra-cavity power can for example be increased or maximized by implementation of a figure eight (F8) configuration, e.g., as shown in FIG. 5b. Here similar components as already described with respect to FIG. 4 are used. An isolator ensuring unidirectional operation on the loop on the left-hand side is added as well as an output fiber coupler. The output coupler is inserted after the end of propagation through the gain fiber in order to increase or maximize the achievable output power.

For a comb laser operating at a repetition frequency of 100 MHz and producing a timing jitter less than 1000 as (in a frequency range from 10 kHz to 50 MHz), a single side-band phase noise spectral density of less than −140 dBc/Hz can be obtained for a 10 GHz carrier at a frequency offset of 100 kHz. For a timing jitter less than 150 as, the single side-band phase noise spectral density can be less than −160 dBc/Hz and for a timing jitter less than 50 as, the single side-band phase noise spectral density can be less than −170 dBc/Hz. For a timing jitter less than 10 as, a phase noise spectral density less than −180 dBc/Hz can be achieved. Even for an RF carrier of 25 GHz the possible phase noise is only $(25/10)^2 \Leftrightarrow 7.96$ dB times higher than the foregoing values at 10 GHz. Thus the single side-band phase noise spectral densities at 25 GHz correspond to values of −132, −152, −162 and −172 dBc/Hz, for timing jitters less than 1000 as (in a frequency range from 10 kHz to 50 MHz), less than 150 as, less than 50 as, and less than 10 as, respectively. Such low values of single side-band phase noise at such high RF frequencies are not available from conventional RF oscillators; the utilization of all polarization maintaining fiber combs as described above therefore represents a great advance in RF technology.

Even lower values of single side-band phase noise spectral density are possible. Rather than using RF generation via VCOs as described in some examples here, low phase noise RF generation is also possible via the use of direct photo-detection as for example described in U.S. Pat. No. 7,809, 222 to Hartl et al., which is hereby incorporated by reference herein in its entirety for all it discloses. To generate an RF tone at, e.g., GHz level RF frequencies it is further useful to multiply the repetition rate of the oscillator by a factor of n with an (n−1) stage optical delay line as for example described also in U.S. Pat. No. 7,809,222 to Hartl et al. With such a delay line the repetition rate of a fiber oscillator (which is typically in the 20-400 MHz range) can be increased to the 1-20 GHz range. A higher repetition rate generates a higher RF power at GHz frequencies and leads to lower shot noise and lower thermal noise for the RF signal.

Referring back to FIGS. 1 and 2, for such a configuration low phase noise RF generation is not only facilitated by a pulse source with low timing jitter, the beat signals $f_{b1}$ and $f_{b2}$ themselves also may contribute to RF phase noise. These beat signals can typically be stabilized with a signal-to-noise (S/N) ratio greater than 40 dB at a resolution bandwidth of 100 kHz, which corresponds to 90 dB at 1 Hz. The resulting single sideband RF phase noise $\varphi_m$ can then be estimated from eq. (4) as $\varphi_m \approx [-(S/N) - 10*\log(2j)^2]$ dBc/Hz, so with $j \approx 600$, we can expect $\varphi_m \approx [-90 \text{ dB} - 62 \text{ dB}]$ dBc/Hz$=-152$ dBc/Hz. Clearly is it useful to use large values of j (e.g., j>100) and to further increase or optimize the S/N ratio of $f_{b1}$ and $f_{b2}$ to be larger than 40 dB at 100 kHz resolution bandwidth. S/N ratios greater than 60 dB at 100 kHz resolution bandwidth can be obtained with fiber lasers with high values of output power. Therefore, the same optimization that can be used to ensure a low overall timing jitter can also facilitate a low noise floor in RF generation via the use of a VCO. For example a F8 laser configuration 500 as described with respect to FIG. 5b can be used to increase or maximize the output power of the comb laser.

Figure 6:
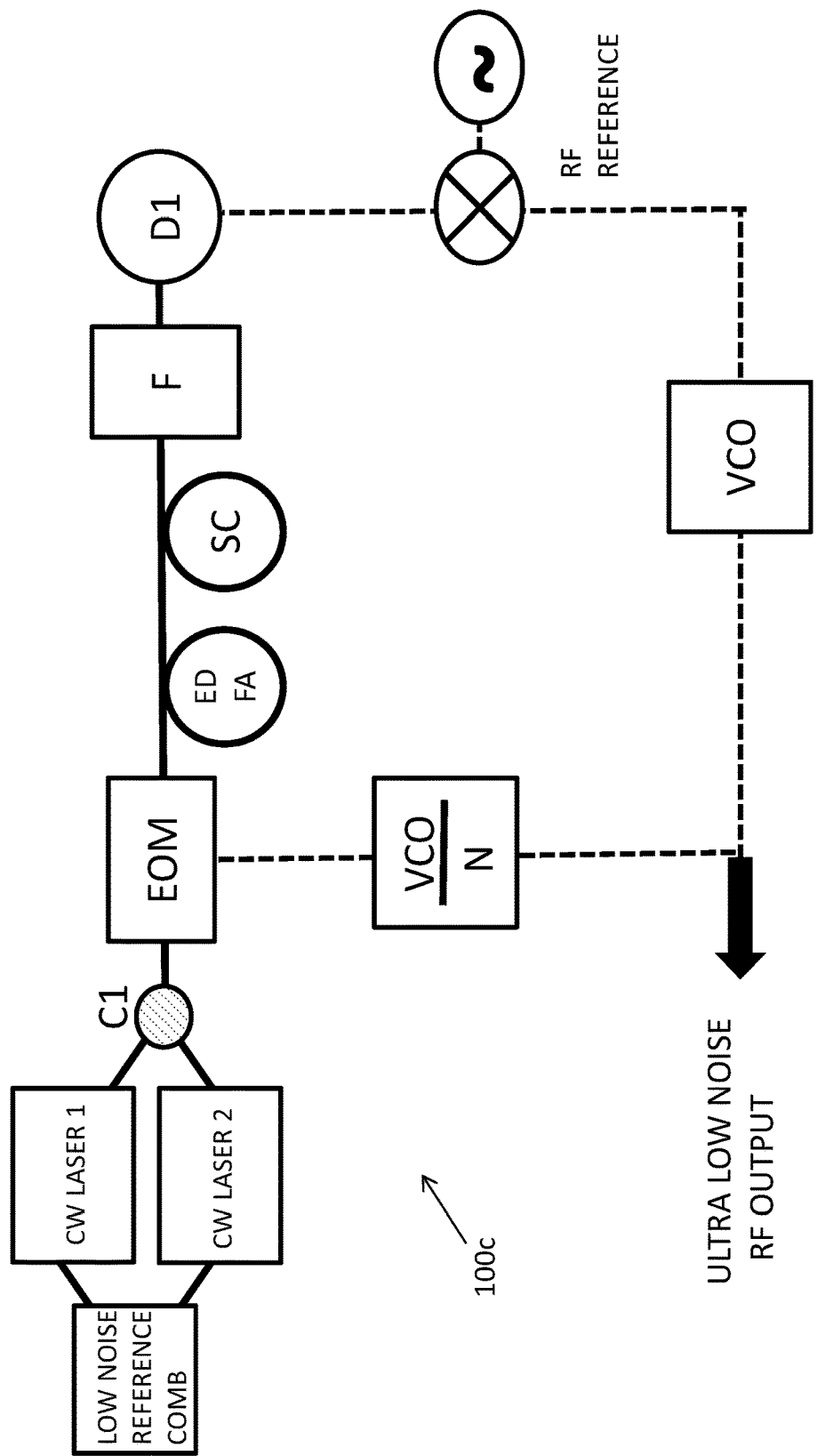
FIG. 6 schematically illustrates an example arrangement for phase noise reduction of a voltage controlled oscillator (VCO) using a comb laser as a frequency reference and phase modulation of two cw lasers.

In some applications it may be preferable to use a low noise reference comb laser in conjunction with two modulated cw lasers to generate an error signal for phase noise reduction of a VCO. An example of such a low phase noise RF source 100c is shown in FIG. 6. Here two cw lasers operating at two distal spectral regions of the optical spectrum of the comb laser are used. For example, the optical spectrum of the comb laser may be in the ranges from about 1.3-1.7 µm with the cw lasers located near the distal ends of the spectrum. For example, a distal end of the spectrum can occur at a wavelength at which the power has decreased to a fraction of a peak power. The fraction may be, for example, 50%, 75%, 90%, 95%, etc. The fraction may represent a power decrease of, e.g., 3 dB, 6 dB, 10 dB, etc. Narrower and broader spectral regions can also be used. The two cw lasers are further phase-locked to two individual comb lines of the comb laser. Alternatively, the two comb lines can be used directly by using appropriate narrow bandpass optical filters. Also the comb laser can be free running or it can be phase locked to external optical reference signals with $f_r$ stabilized; no stabilization of $f_0$ is required.

The two cw lasers are further combined with coupler C1 and then passed through an EOM or an arrangement of cascaded EOMs for frequency side-band generation. The modulated cw lasers are then amplified in an erbium doped fiber amplifier (EDFA) and transmitted through a supercontinuum fiber (SC) or other nonlinear waveguides for further spectral broadening. Alternatively, two different amplifiers can be used for widely spaced cw lasers, such as for example an EDFA and a thulium fiber amplifier. The whole system is further configured such that the broadened supercontinuum spectra from the two modulated cw lasers overlap spectrally in a frequency range somewhere in the middle between their respective optical carrier frequencies. A beat signal $S_b$ between two higher-order side bands from the two modulated cw lasers is then filtered out with an optical filter (F) and detected with detector D1. An error signal is then created via comparison of this beat signal with an external RF reference signal and used to suppress the phase noise of the VCO, generating an ultra-low phase noise RF output. The cw laser can then also be used as a transfer oscillator to increase the S/N ratio of the beat signal $S_b$. Though this system construction is slightly more complex than the system described with respect to FIG. 1, a higher S/N ratio for the error signal controlling the VCO can be obtained, which can be of advantage for ultra-low phase noise RF generation as discussed above. In this configuration as also in the other configurations discussed, it is also possible to drive the EOM with a frequency divided output of the VCO to generate low phase noise RF frequencies for RF frequencies greater than 25 GHz. A fraction of the VCO output divided by an integer fraction N is then used to modulate the EOM, as shown in FIG. 6 also. VCOs operating at frequencies greater than about 25 GHz and up to hundreds of GHz, for example 100 GHz, 200 GHz, or 500 GHz, are readily available and can be based on, for example, CMOS technology. Chip scale frequency dividers operating at frequencies greater than 100 GHz are equally available and can be utilized.

Figure 7:
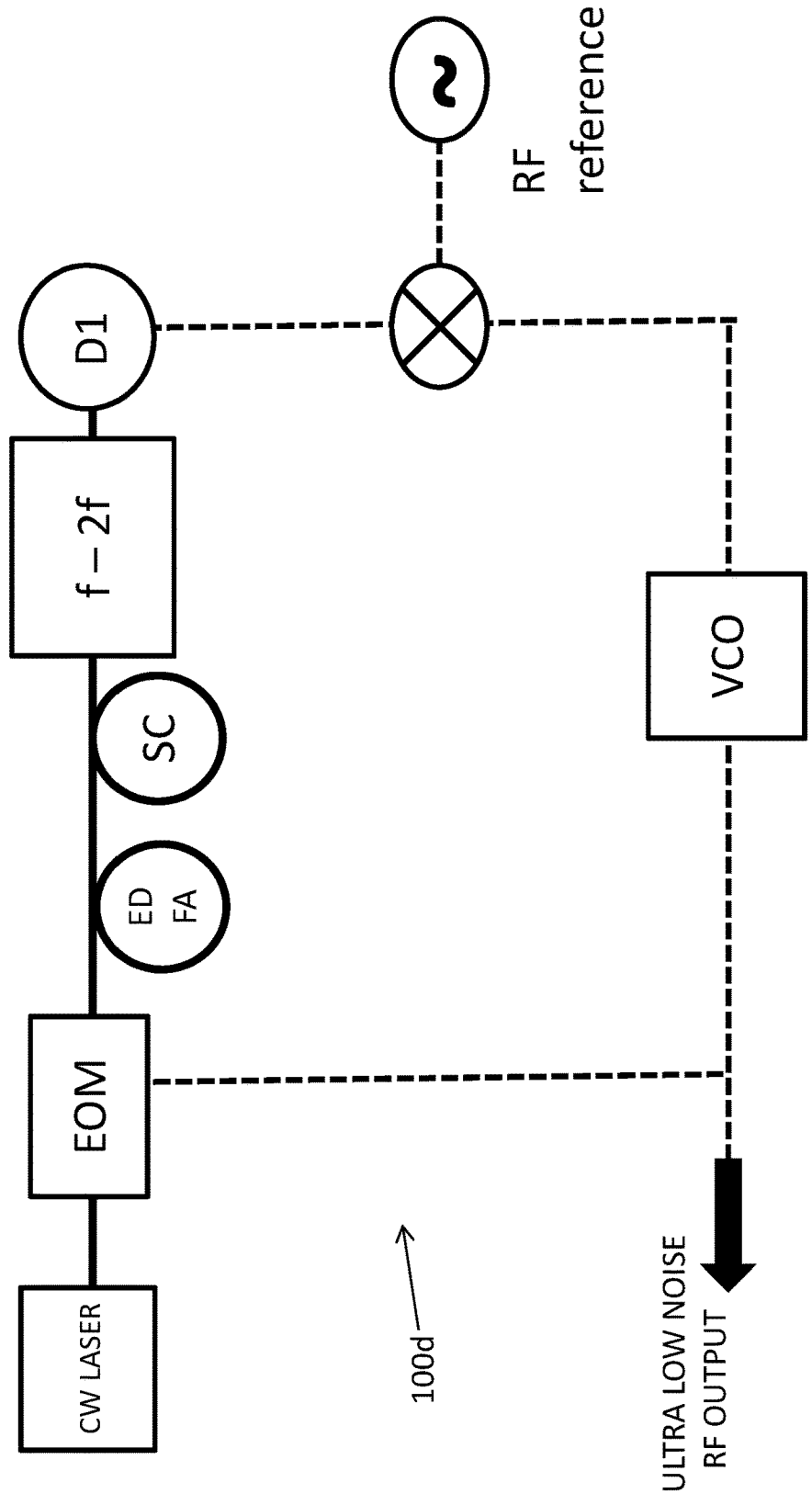
FIG. 7 schematically illustrates an example arrangement for phase noise reduction of a voltage controlled oscillator (VCO) using phase modulation of one cw laser in conjunction with broadband supercontinuum generation.

In some applications a reference comb laser may not be available. In this case an error signal for the generation of a low phase noise RF signal can be obtained using a system 100d as shown in FIG. 7. Here a cw laser is frequency broadened via phase modulation using appropriately cascaded electro-optic modulators driven by a VCO, as for example described in JP2014135341A, 'Optical frequency comb stabilization light source and method' to A. Ishizawa et al. After amplification in a fiber amplifier such as an EDFA and supercontinuum generation, an f-2f interferometer can be used to frequency double the red part of the supercontinuum with the blue part to generate a beat signal. This beat signal contains the amplified phase noise of the EOM (arrangement) modulation frequency and can then be used as an error signal to reduce the phase noise of the VCO and an ultra-low phase noise RF output. Since detection of an f-2f signal from a supercontinuum spectrum generated with a modulated cw laser is particularly challenging, it may be further advantageous to use an 2f-3f or an 3f-4f interferometer. Particularly useful are 2f-3f waveguide based interferometers as disclosed in U.S. Pat. No. 7,809,222, 'Laser based frequency standards and their applications' to Hartl et al. ("'222"). As discussed in '222 such waveguide interferometers can be based on periodically poled LiNbO$_3$ (PPLN) waveguides and allow frequency conversion of very low peak power light signals. In an example configuration the cw laser can be selected with an operation wavelength in the Er amplifier range from 1.50-1.65 µm. The modulation frequency of the cw laser can be 25 GHz and three cascaded EOM phase modulators can be used for spectral side-band generation. The EOM amplitude modulator can then be selected to reduce the repetition rate of the generated pulse train to around 1 GHz. Assuming a cw laser operating at 1.56 µm, the supercontinuum fiber can produce an optical spectrum extending from 1.2-2.0 µm. The red part of the spectrum can further be amplified in a Tm amplifier. A PPLN waveguide can then be used to observe, for example, a 2f-3f beat signal in the 630-660 nm spectral range.

Low phase noise and low timing jitter oscillators as discussed above can also be used directly for low phase noise RF generation. An example of such a system 100e is discussed with respect to FIG. 8. In this example, the use of two comb lasers is assumed. The combs can be based on fiber, solid-state or diode lasers. The combs can be generated via active or passive modelocking; also the use of harmonic modelocking is possible. The two combs are arranged in a master-slave configuration, where the slave also incorporates a modulator. AOM, EOM amplitude or phase modulators can be used. As an example, combs as described with respect to FIG. 4 can be used for the master and slave. Additional mechanisms for slow repetition rate control of the slave laser, such as piezoelectric materials (e.g., PZTs) can also be included in the slave comb to approximately lock the repetition rate of the slave to the master.

The pulse trains generated from the two combs are compared with the balanced cross correlator. The cross correlator produces an error signal which is used for both low bandwidth repetition rate control of the slave comb and high bandwidth frequency control of the VCO via the insertion of appropriate RF filters (not shown). The modulator is driven by the shown VCO which is operating at a modulation frequency $f_M$ close to the fundamental repetition rate of the slave comb or a harmonic of it, e.g., $N \times f_M$. For a certain frequency range the repetition rate of the slave laser follows the modulation frequency of the VCO. Hence the cross correlator is used for high bandwidth frequency control of the slave laser and for locking the repetition rate of the slave to the master via the VCO. Since the phase noise of the VCO at the modulation frequency is transferred to the phase noise of the slave laser at its repetition frequency, the balanced cross correlator is sensitive to the phase noise of the VCO and can reduce it via comparison to the ultra-low phase noise master comb. To increase the locking range of the slave laser to the VCO, it is further useful not to operate the slave laser near zero dispersion, but instead to provide some anomalous dispersion within the slave laser.

Advantageously, the phase noise of the VCO can be reduced to the phase noise of the ultra-low phase noise comb master. For example with the comb lasers as discussed with respect to FIG. 4 operating at a comb repetition rate of 70 MHz, a single side-band (ssb) phase noise density $L_{ssb}$(100 kHz) less than −140 dBc/Hz at a frequency offset of 100 kHz for an RF frequency of around 10 GHz is achievable. For a timing jitter of around 50 as, a timing jitter $L_{ssb}$(100 kHz) less than −170 dBc/Hz can be approached.

Figure 9A:
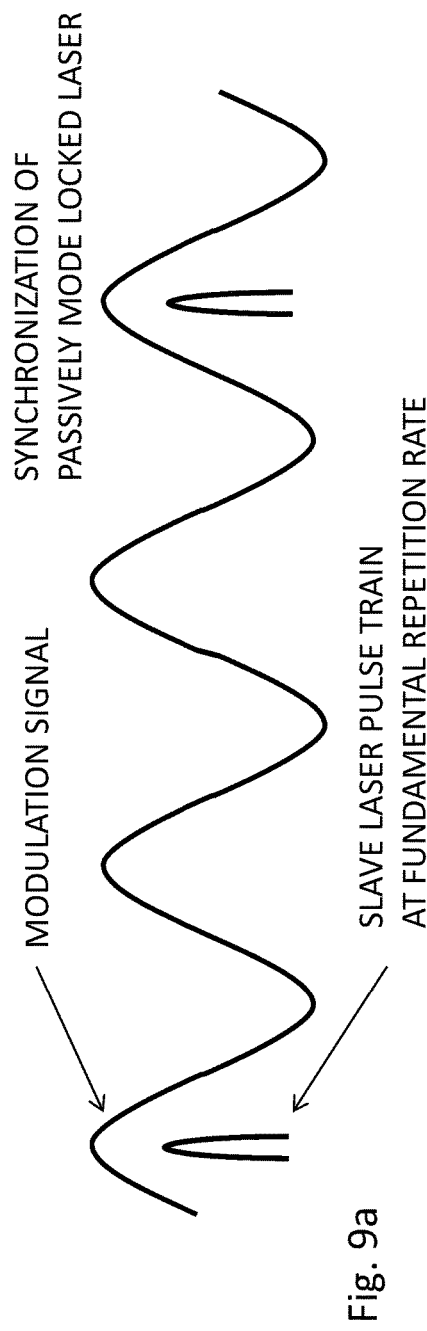
FIG. 9a shows an example of an applied modulation signal with respect to the generated pulse train of a passively mode locked comb laser with respect to the generated pulse train.

An RF signal at a harmonic N of the slave repetition rate $f_M$ can be achieved via optical repetition rate multiplication. An example of the principle of this scheme is shown in FIG. 9a when using a passively mode locked comb laser. Individual laser pulses from the laser pulse train are shown as well as an applied modulation signal at a harmonic of the laser repetition rate. For a mode locked laser passively mode locked with a strong modelocking mechanism such as a NALM, the high frequency modulation at the harmonic of the repetition rate does not lead to the creation of additional pulses at that harmonic and hence the pulses oscillate at the fundamental repetition rate of the oscillator with the pulse width mainly determined by the passive modelocking mechanism. Hence the pulse train can be synchronized to a modulation signal at harmonic of the laser repetition rate.

Figure 9B:
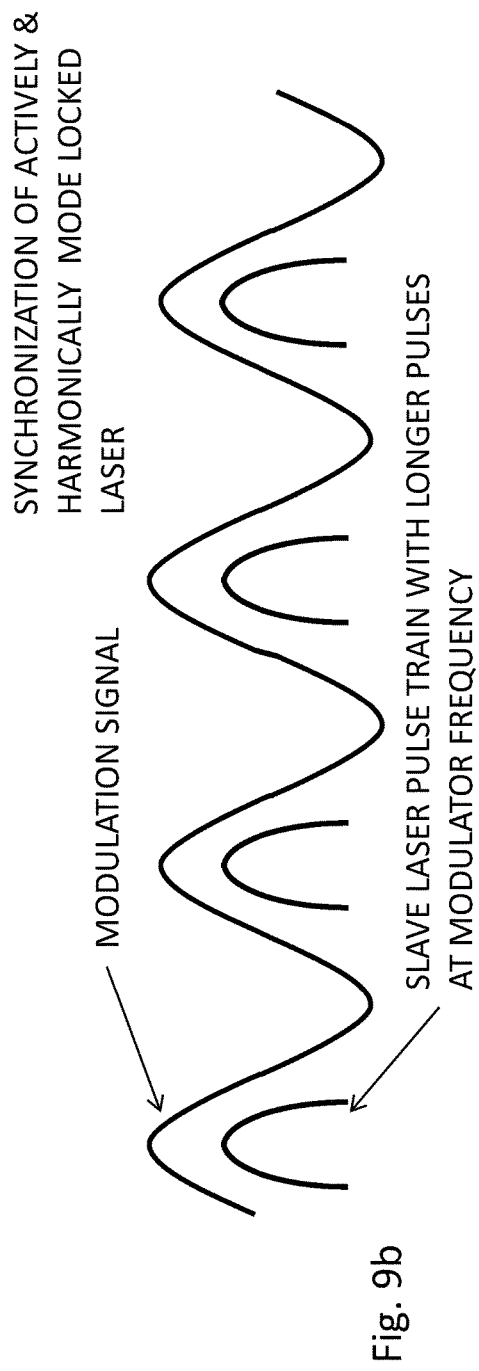
FIG. 9b shows an example of an applied modulation signal with respect to the generated pulse train of an actively and harmonically mode locked comb laser with respect to the generated pulse train.

This can be contrasted to the case of a harmonically mode locked laser in the example shown in FIG. 9b; here the modelocking mechanism is weaker and the oscillating pulse width is determined to a large extent by the active modelocking mechanism. As a result the pulses are generated at the modulation frequency of the modulator.

For the example shown in FIG. 9a, pulse widths down to 100 fs or shorter can be achieved, whereas for the example shown in FIG. 9b, the generated pulse widths are on the order of 1 ps long. In either case, a pulse train as shown in FIG. 9a or FIG. 9b can be synchronized to an ultra-low noise comb master oscillator via a VCO for low phase noise RF generation at a harmonic of the fundamental repetition rate of the master comb.

The balanced cross correlator as referred to above relies on measurements in the time domain; however, even higher sensitivity can be achieved when using frequency domain measurements. A measurement in the frequency domain is quite similar to the measurement technique already discussed with respect to FIG. 2 and is discussed with respect to FIG. 10. It is based on interference of the comb lines of the high-rep. rate slave comb with the low rep. rate master comb at two widely separated spectral locations of the comb spectrum $(x-\Delta)^* f_r$ and $(x+\Delta)^* f_r$; specifically beat signals between individual comb lines can be observed from the master of order $m = x - \Delta$, $n = x + \Delta$ with comb lines from the slave of order $y-j$, $y+j$, where x, y are the order of the comb modes near the optical carrier frequency of the two combs respectively. The relevant comb lines are enclosed by the ovals in FIG. 10. Again, comparison of comb modes of the same order is assumed, but this is not a requirement.

Figure 10:
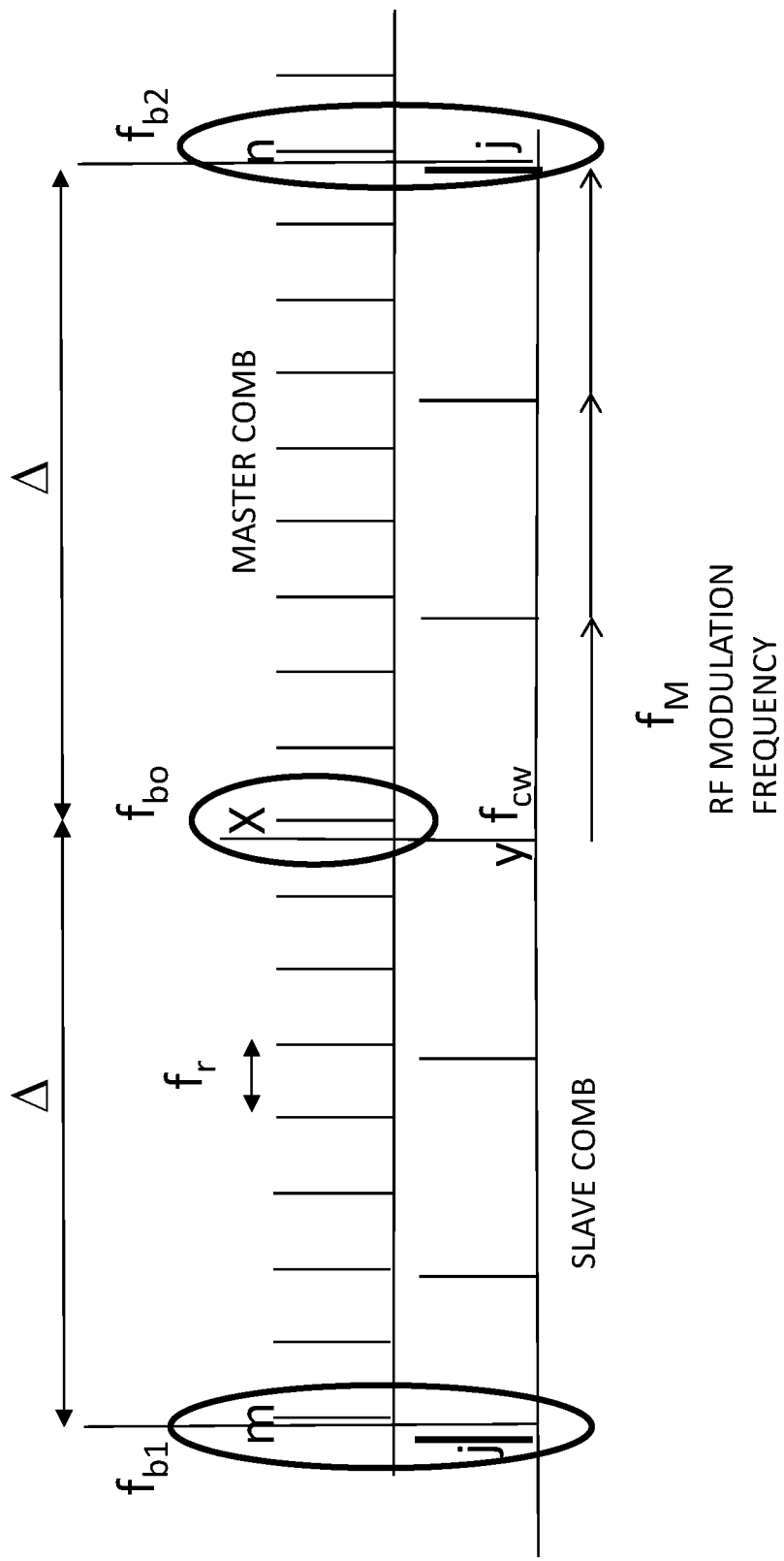
FIG. 10 schematically illustrates an example of the comb modes involved in phase noise reduction of a VCO using a master slave arrangement of two comb lasers.

To isolate these comb lines, two additional cw reference lasers are useful with emission frequencies $f_{cw1}$ and $f_{cw2}$ located close to the pair of order $(x-\Delta)$, $(x+\Delta)$ and $(y-j)$, $(y+j)$ respectively, as illustrated in FIG. 10. The two cw reference lasers are transfer oscillators used to isolate individual comb mode pair modes from all the other comb modes and therefore do not impact the frequency noise of the beat signals between the comb modes. For example the transfer oscillator frequency $f_{cw1}$ is eliminated when recording a beat signal $f_{t1} = (x-\Delta)f_r + f_{ceo1} - f_{cw1}$ and $f_{t2} = (y-j)f_M + f_{ceo2} - f_{cw1}$ and electronically mixing $f_{t1}$ with $f_{t2}$. When observing the relevant beat signals near $f_{cw1}$ and $f_{cw2}$ the following beat signals can be observed:

$$f_{b1} = (x-\Delta)^* f_r - (y-j)^* f_M - \Delta f_{ceo} \quad (6)$$

$$f_{b2} = (x+\Delta)^* f_r - (y+j)^* f_M - \Delta f_{ceo}, \quad (7)$$

where $\Delta f_{ceo}$ is the difference in the carrier envelope offset frequencies of the two combs. When mixing $f_{b1}$ with $f_{b2}$ the following is obtained:

$$F = f_{b1} - f_{b2} = 2(jf_M - \Delta f_r) \quad (8)$$

For high frequency offsets from the RF frequency $f_M$ a substantial phase noise reduction can be obtained, similar to the method described with respect to FIG. 2. To achieve substantial phase noise reduction at low frequency offsets, $f_r$ can be stabilized with a stable optical clock $f_{cw}$, e.g., when stabilizing the beat signal $f_{bo} = f_{cw} - xf_r$, similar to what was discussed with respect to FIG. 2. Generating the signal $f_{bo}' = f_{bo} * (2\Delta/x)$ and mixing with F then produces a beat signal independent of $f_r$:

$$F - f_{bo}' = 2jf_M - (2\Delta/x)f_{cw}. \quad (9)$$

The phase noise for $f_M$ can then be reduced by the factor (2j) if $F - f_{bo}'$ is stabilized via feedback to $f_M$. Since both master and slave are short pulse lasers, large values of j can be obtained and efficient phase noise reduction produced.

This frequency domain method is also compatible with harmonic modelocking and can be used to reduce the phase noise of harmonic modelocking. Other methods for frequency stabilization of the master comb can also be used.

The use of a master comb is further not required; it is sufficient to provide two stable cw reference lasers to replace the two reference comb lines provided by the master comb. Equally, when stabilizing f0 of the comb laser or eliminating f0 electronically, only one stable cw reference laser can be used to provide an error signal for phase noise reduction of the VCO.

Referring again back to FIG. 1, as discussed before in order to achieve low phase noise RF generation, the detection of $f_{b1}$ and $f_{b2}$ with high S/N ratio is important. The limit for achievable S/N is typically governed by shot noise of the individual comb lines, which can be shown to be around $h\nu/\eta P$, where h is Planck's constant, $\nu$ is the optical frequency, $\eta$ is the quantum efficiency of the detector and P is the power per comb line. Particularly for fiber lasers, shot noise typically limits the achievable S/N ratio to around 90-120 dBc/Hz. The construction of high power oscillators to ensure operation with low timing jitter as previously discussed is a viable option to maximize the S/N ratio, but may also be prohibitively expensive under certain circumstances.

Figure 11:
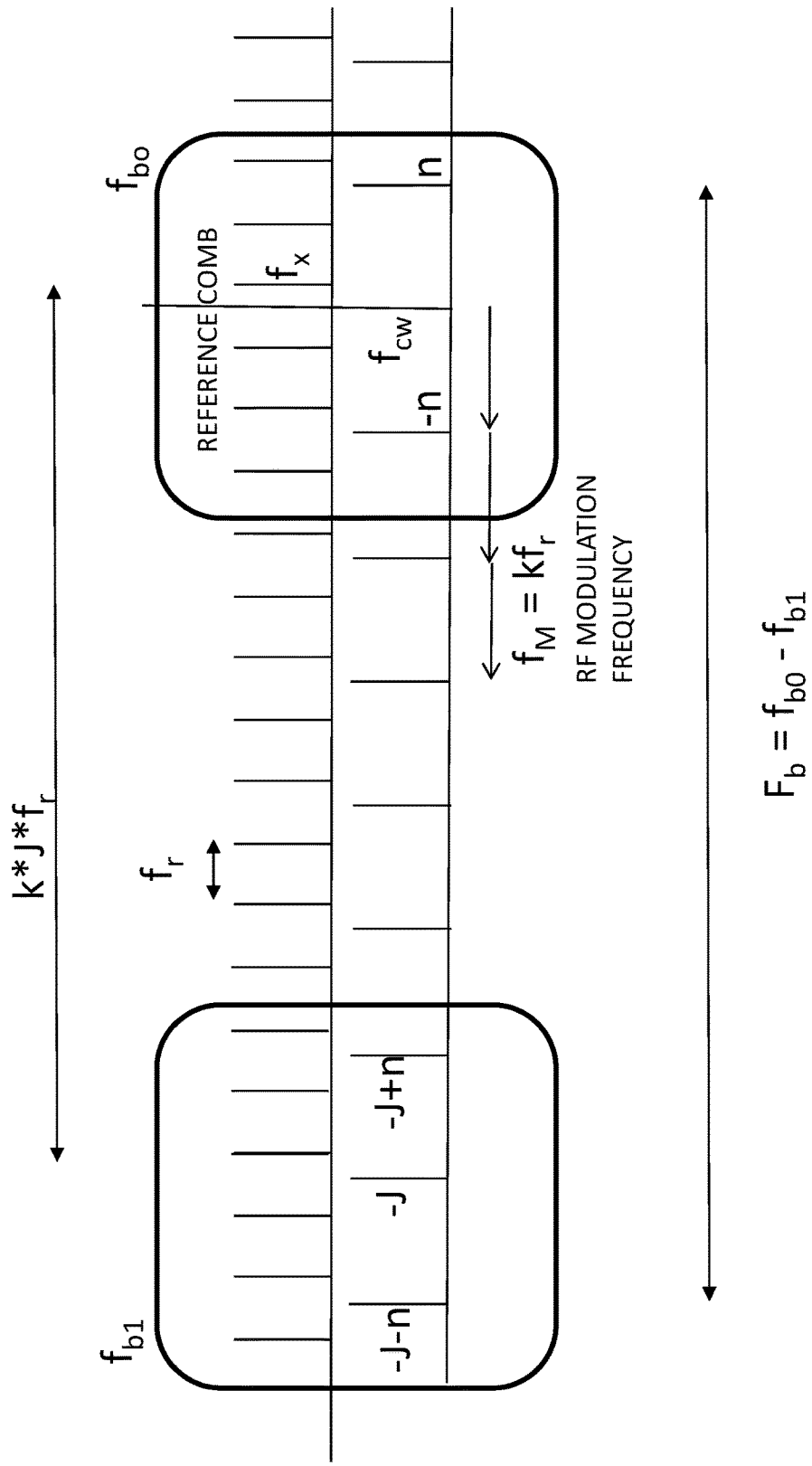
FIG. 11 schematically illustrates an example of the comb modes involved in coherent addition of beat notes when referencing a VCO based comb to a comb reference laser.

Another method for maximizing the S/N ratio is via coherent addition of various beat signals near $f_{b1}$ or $f_{b2}$, as illustrated in FIG. 11. When adjusting $f_r$ and $f_M$ to be exact multiples of each other, such that $f_M=k\times f_r$, the S/N ratio of beat signals between the cw laser (and its sidebands) and the fiber comb can be greatly enhanced by coherent addition of several beat signals in the RF domain. With $f_M=k\times f_r$ all cw laser sidebands are proximate to comb lines from the reference comb laser separated in frequency space exactly by $f_{cw}-f_x$, where we further define $f_x=x\times f_r+f_0$.

The cw laser is then locked to the reference comb via phase locking of the beat signal $f_{bo}$ which comprises for example frequency pairs of form $[(-n\times f_M+f_{cw}), (-n\times k\times f_r+f_x)]$ to $[(n\times f_M+f_{cw}), (n\times k\times f_r+f_x)]$, where the range of n is limited by an optical filter. As mentioned above all frequency pairs have exactly the same beat frequency $f_{cw}-f_x$, whereas the phase noise of the beat frequencies increases with order $n^2$. For small n, the phase noise increase with n can be neglected and the S/N ratio of $f_{bo}$ increases approximately proportional to the number of comb lines 2n that coherently add to produce $f_{bo}$. The S/N ratio increase is limited by the additional shot noise of the comb lines from the reference comb which do not contribute to $f_{bo}$, but this can be typically neglected since the power per comb mode in the cw laser and its sidebands is much higher than the power per comb line in the reference comb.

Similarly, by comparing $f_{b1}$ to an external RF reference signal, an error signal for stabilization of $f_M$ can be provided. A stabilization of the carrier envelope offset frequency $f_o$ in the comb is not required, as both $f_{b0}$ and $f_{b1}$ are subject to the same fluctuations of $f_o$. Also, similarly, with $f_M=k\times f_r$, $f_{b1}$ is made up of frequency pairs of form $[(-n-J)\times f_M+f_{cw}), (-n-J)\times k\times f_r+f_x)]$ to $[(n-J)\times f_M+f_{cw}), (n-J)\times k\times f_r+f_x)]$, where the range of n is again limited by an optical filter and we assume for the simplicity that the bandwidth of the optical filter for detection of $f_{bo}$ and $f_{b1}$ is the same (although this is not required). Similarly, a beat signal on the right hand side of $f_{bo}$ (not shown in FIG. 11) could be used. For small n, the phase noise increase with n can be neglected and the S/N ratio of $f_{bo}$ increases approximately proportional to the number of comb lines 2n that coherently add to produce $f_{b1}$.

Since low noise frequency dividers are readily available, it is further possible to operate the VCO with a modulation frequency $f_M$ and then to generate $f_r$ via frequency division of $f_M$ by an integer value k, where the comb laser repetition rate is further locked in the RF domain by detection of the comb output and phase locking $f_r$ to $f_M/k$. Once the VCO is locked to the reference comb via beat $f_{b1}$, this is not required. Also, separately phase locking $f_o$ to an external RF reference can also help with the overall stability of the system, but is not a requirement. As described with respect to FIG. 1, the frequency comb can be free running, e.g., $f_r$ or $f_0$ do not need to be stabilized to produce a substantial reduction in phase noise for $f_M$, especially for a large frequency offset from an RF carrier frequency.

Figure 12:
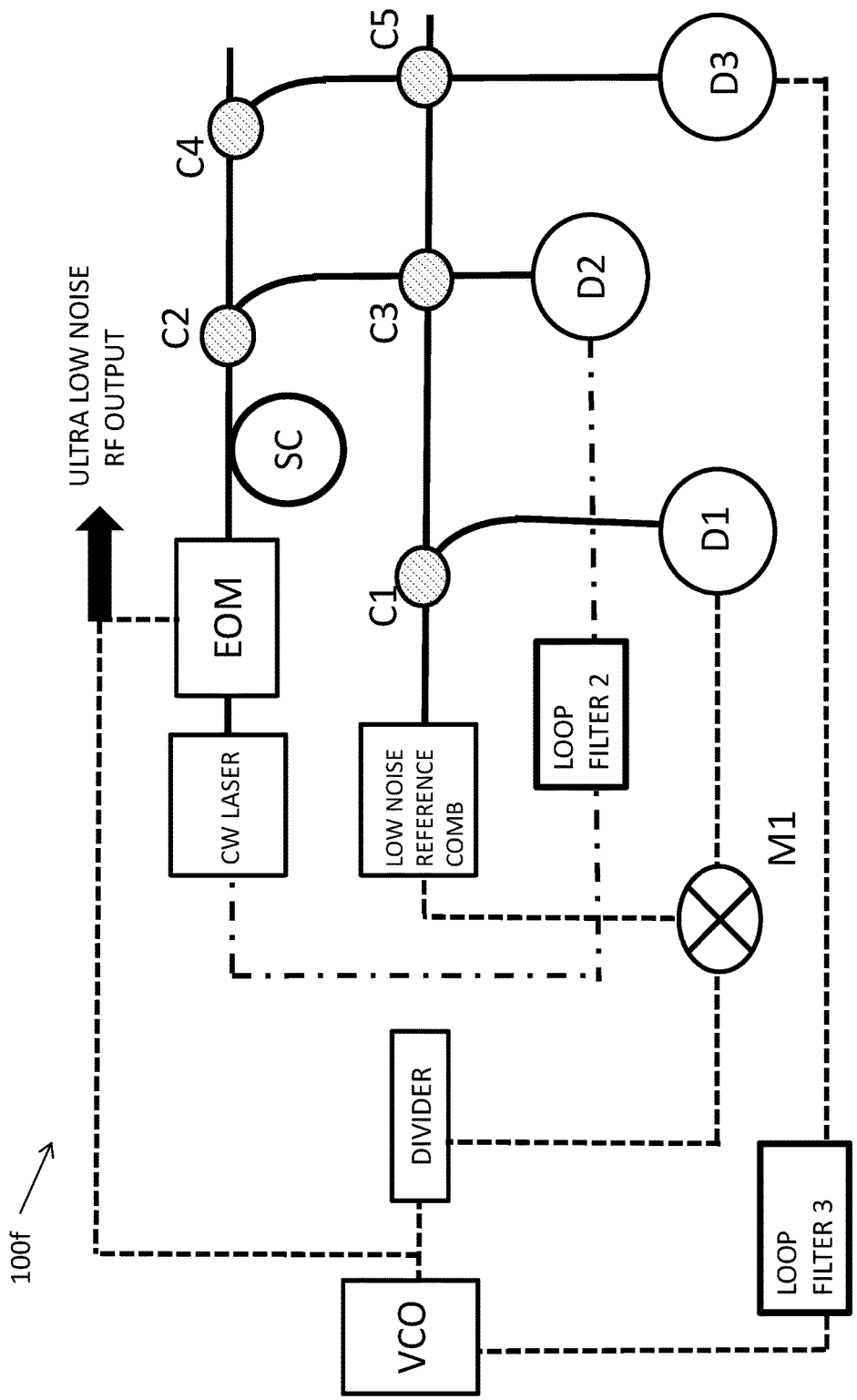
FIG. 12 schematically illustrates an example of an experimental arrangement involved in the coherent addition of beat notes when referencing a VCO based comb to a comb reference laser.

An example system 100f with coherently enhanced beat signals is shown in FIG. 12. The individual components are very similar to the components shown in FIG. 1. A passively mode locked comb laser provides a stable comb reference spectrum (low noise reference comb) which can be characterized by comb modes $f_n=f_o+n\times f_r$. The reference comb repetition rate $f_r$ can further be stabilized by locking one of the reference comb lines to a first cw laser (not shown), which can in turn be frequency stabilized by locking its frequency to an external reference cavity or an optical clock transition as discussed with respect to FIG. 1; the carrier envelope offset frequency $f_0$ can also be phase locked to a reference frequency or electronically subtracted in this context as also discussed with respect to FIG. 1. Any optical elements implemented for supercontinuum generation or the construction of an f-2f interferometer for the ultra-low noise reference comb are not separately shown in FIG. 12. A second cw laser is further provided, which can, but need not, be identical to the first cw laser. It is assumed in the following that only one cw laser is used. Sidebands to the cw laser at an RF modulation frequency $f_M$ are then generated via a modulator (EOM) driven by a VCO as discussed with respect to FIG. 1. As discussed above it is further useful to divide the VCO output frequency $f_M$ by a factor k and lock the repetition rate of the low noise reference comb to $f_M/k$ using coupler C1, detector D1, mixer M1 and a first loop filter. This lock can be done with a very low feedback bandwidth in the range from 10-1000 Hz, so as to not add additional noise to the comb reference laser. However, once the VCO is locked via beat $f_{b1}$, this is not required. Alternatively, the frequency comb can also be free running and does not need to be stabilized.

The cw laser is locked to the low noise reference comb via detection of the beat signals $f_{bo}$ close to the frequency of the cw laser using couplers C2, C3, detector D2 and loop filter 2. Alternatively, the reference comb can be locked to a cw reference laser with the same arrangement and use of beat signal $f_{bo}$. As another alternative, the VCO can be locked via an error signal generated via detection of beat signal $f_{b1}$ using couplers C4, C5, detector D3 and loop filter 3. An S/N enhancement of 10-1000 times can be achieved with this scheme compared to the detection of beat signals between individual frequency tones.

In some applications, the noise of the cw laser or $f_o$ can be a limitation. As discussed with respect to FIG. 1, in this case it can be further advantageous to generate a beat signal $F_b=f_{bO}-f_{b1}$ via for example the use of a double balanced mixer. By comparing $F_b$ to an external RF reference signal, an error signal for stabilization of $f_M$ can be provided. However, in contrast to FIG. 1, in FIG. 11 $F_b$ is at DC, since $f_{bo}$ and $f_{b1}$ are at exactly the same frequency. To shift $F_b$ from DC an additional frequency shifter such as an acousto-optic or electro-optic modulator can be implemented. Referring to FIG. 12, the frequency shifter can be inserted between couplers C2 and C4 or between couplers C3 and C5 and be driven by a separate RF frequency $F_s$. Other arrangements are also possible. By comparing $F_b-F_s$ to an external RF reference signal, an error signal for stabilization of $f_M$ can be provided.

Further, as explained with respect to FIG. 1, cascaded EOMs can be used to generate high order spectral side-bands to the cw laser via frequency modulation with $f_M$. To maximize the coherence of these side-bands it may be further useful to implement more than one stage with spectral side band generation. In such configurations, a limited number of spectral side bands are generated via one or more EOMs in a first stage, the generated waveform is then compressed in the time domain via the use of appropriate dispersive components and the number of side bands is further increased via the addition of a highly nonlinear waveguide. This was already discussed with respect to FIG. 1. Additional stages can then be added by compressing the output from the highly nonlinear fiber and injecting the output back into a second highly nonlinear fiber. Additional optical amplification stages can also be inserted as needed. Moreover the number of spectral sidebands generated via modulation of a cw laser with an EOM can further be increased by inserting the EOM into a cavity as for example described in P. Shen et al., 'Analysis and Demonstration of a Fast Tunable Fiber-Ring-Based Optical Frequency Comb Generator', J. Lightwave Technology, 25, 3257 (2007). Such system implementations are not separately shown. Other methods for spectral sideband generation via modulation of a cw laser with EOM are also possible.

For many applications not only low phase noise RF signals with fixed frequencies are required, but also frequency tunable RF signals. With the set-up as shown in FIG. 12, an RF frequency at any integer multiple of $f_r$ can be generated. For example of a reference frequency comb operating at 100 MHz, low noise RF frequencies at frequencies of 10.0, 10.1, 10.2, 10.3 GHz etc. can be generated. To generate low phase noise RF signals at intermediate frequencies, the comb spacing of the reference comb can also be appropriately tuned. The above approach allows for the generation of low phase noise RF signals essentially at any desired frequency.

Additional Aspects of the Disclosure

In a 1st aspect, a source of low phase noise microwave frequencies is provided. The source comprises: a mode locked comb laser; a cw laser, said cw laser being modulated with an optical modulator, wherein said optical modulator is driven by a micro-wave frequency generated with a controllable microwave generator, said optical modulator generating side-bands to the cw laser in the frequency domain with a frequency spacing given by the modulation frequency of the optical modulator; a nonlinear medium to nonlinearly broaden the spectral extent of said side-bands, a detector arrangement configured to detect primary beat signals between two individual comb modes from said comb laser with the frequency side-bands from the cw laser, a radio frequency (RF) mixer to mix said two primary beat signals thereby generating a secondary beat signal, said secondary beat signal comprising amplified phase noise from said micro-wave frequency generated by said controllable microwave generator; a servo loop using feedback from said secondary beat signal to reduce the phase noise of said micro-wave frequency.

In a 2nd aspect, a source of low phase noise microwave frequencies according to aspect 1, wherein a comb mode of said mode locked comb laser is locked to a cw laser to increase stability of said mode locked comb laser.

In a 3rd aspect, a source of low phase noise microwave frequencies according to aspect 1 or aspect 2, said optical modulator comprising an electro-optic phase modulator.

In a 4th aspect, a source of low phase noise microwave frequencies according to any one of aspects 1-3, said optical modulator comprising more than one cascaded electro-optic phase modulators and at least one electro-optic amplitude modulator.

In a 5th aspect, a source of low phase noise microwave frequencies according to any one of aspects 1-4, further comprising at least one optical amplifier.

In a 6th aspect, a source of low phase noise microwave frequencies according to any one of aspects 1-5, wherein said mode locked comb laser is free running, and comprises one or more of a solid-state, fiber or diode mode locked laser.

In a 7th aspect, a source of low phase noise microwave frequencies according to aspect 6, said comb laser being constructed from all polarization maintaining fiber.

In an 8th aspect, a source of low phase noise microwave frequencies according to aspect 6, said comb laser further comprising a nonlinear amplifying loop mirror.

In a 9th aspect, a source of low phase noise microwave frequencies according to any one of aspects 1-8, configured to produce a single-side band phase noise density for a 10 GHz carrier of less than −140 dBc/Hz at a frequency offset of 100 kHz.

In a 10th aspect, a source of low phase noise microwave frequencies according to any one of aspects 1-9, further configured to produce a single-side band phase noise density for a 10 GHz carrier of less than −160 dBc/Hz at a frequency offset of 100 kHz.

In an 11th aspect, a source of low phase noise microwave frequencies according to any one of aspects 1-10, further configured to produce for an RF carrier frequency of x GHz a single-side band phase noise density less than −140 dBc/Hz+10*log (x/10 GHz)$^2$ dBc/Hz at a frequency offset of 100 kHz.

In a 12th aspect, a source of low phase noise microwave frequencies according to any one of aspects 1-11, further comprising at least one stable cw reference laser, said comb laser further configured to allow for phase locking of at least one isolated comb mode from said comb laser to said at least one stable cw reference laser.

In a 13th aspect, a source of low phase noise microwave frequencies according to aspect 12, further configured to produce a tertiary beat signal.

In a 14th aspect, a source of low phase noise microwave frequencies according to aspect 13, wherein said controllable microwave generator comprises a voltage controlled oscillator (VCO), said source further comprising an RF divider to divide said tertiary beat signal by a constant factor and an RF mixer to mix said divided tertiary beat signal with said secondary signal, thus creating a quaternary beat signal, said quaternary signal comprising amplified phase noise from said micro-wave frequency generated by said VCO; said source using feedback from said quaternary beat signal to reduce the phase noise of said micro-wave frequency.

In a 15th aspect, a source of low phase noise microwave frequencies according to any one of aspects 1-14, said primary beat signals further being obtained via the use of cw transfer oscillators.

In a 16th aspect, a source of low phase noise microwave frequencies according to any one of aspects 1-15, wherein said controllable microwave generator comprises a voltage controller oscillator (VCO), said source further comprising a frequency divider to divide the frequency generated by the VCO by a constant factor before applying it to the optical modulator.

In a 17th aspect, a source of low phase noise microwave frequencies is provided. The source comprises: a low phase noise free running mode locked comb laser; an optical filter to isolate two of the comb modes from the comb laser, said isolated comb modes being modulated with an optical modulator; said optical modulator being driven by a microwave frequency generated from a voltage controlled oscillator (VCO), said optical modulator generating side-bands to the isolated comb modes in the frequency domain with a frequency spacing given by the modulation frequency of the optical modulator; a nonlinear medium to nonlinearly broaden the spectral extent of said side-bands, two detectors to detect a beat signal between two higher order side-bands originating from the two different individual comb modes; said beat signal comprising amplified phase noise from said micro-wave frequency generated by said VCO; and a servo loop using feedback from said beat signal to reduce the phase noise of said micro-wave frequency.

In an 18th aspect, a source of low phase noise microwave frequencies according to aspect 17, configured to produce for an RF carrier frequency of x GHz a single-side band phase noise density less than −140 dBc/Hz+10*log (x/10 GHz)$^2$ dBc/Hz at a frequency offset of 100 kHz.

In a 19th aspect, a source of low phase noise microwave frequencies is provided. The source comprises: a cw laser;

said cw laser being modulated with an optical modulator; said optical modulator being driven by a micro-wave frequency, said optical modulator generating side-bands to the cw laser in the frequency domain with a frequency spacing given by the modulation frequency of the optical modulator; a nonlinear medium to nonlinearly broaden the spectral extent of said side-bands, and operatively arranged to generate a supercontinuum spectrum; a nonlinear interferometer generating a beat signal, a detector to detect said beat signal; said beat signal comprising amplified phase noise from said micro-wave frequency; said source using feedback from said beat signal to reduce the phase noise of said micro-wave frequency.

In a 20th aspect, a source of low phase noise microwave frequencies according to aspect 19, said nonlinear interferometer comprising a 2-2f interferometer, 2f-3f or 3f-4f interferometer.

In a 21st aspect, a source of low phase noise microwave frequencies according to aspect 20, said nonlinear interferometer comprising a nonlinear waveguide.

In a 22nd aspect, a source of low phase noise microwave frequencies is provided. The source comprises: a mode locked slave comb laser incorporating an intra-cavity modulator driven by a voltage controlled oscillator (VCO) at a modulation frequency, said slave comb laser further configured such that its repetition rate follows at least a subharmonic of said VCO modulation frequency; a mode locked master comb laser; two transfer oscillators configured to facilitate detection of two primary beat signals between two distal pairs of comb lines originating from said two respective comb lasers; two detectors configured to detect said two primary beat signals between said two pairs of comb modes; and a radio frequency (RF) mixer to mix said two primary beat signals thereby generating a secondary beat signal; said secondary signal comprising amplified phase noise from said micro-wave frequency generated by said VCO; a servo loop using feedback from said secondary beat signal to reduce the phase noise of said micro-wave frequency.

In a 23rd aspect, a source of low phase noise microwave frequencies according to aspect 22, further comprising a harmonically mode locked slave comb laser.

In a 24th aspect, a source of low phase noise microwave frequencies is provided. The source comprises: a mode locked slave comb laser incorporating an intra-cavity modulator driven by a voltage controlled oscillator (VCO) at a modulation frequency; said slave comb laser further configured such that its repetition rate follows at least a subharmonic of said VCO modulation frequency; at least one cw reference laser; and at least one detector configured to detect at least one primary beat signal between an isolated comb mode and said cw reference laser; said beat signal comprising amplified phase noise from said micro-wave frequency generated by said VCO; a servo loop using feedback from said beat signal to reduce the phase noise of said micro-wave frequency.

In a 25th aspect, a source of low phase noise ultra-high frequency microwave frequencies is provided. The source comprises: an ultra-high microwave frequency with a frequency greater than about 25 GHz; said ultra-high microwave frequency being generated by a voltage controlled oscillator (VCO); a frequency divider to divide said ultra-high microwave frequency by a constant factor, thereby generating a secondary micro-wave frequency; and an optical feedback system generating an error signal containing amplified phase noise from said secondary micro-wave frequency, said optical feedback system further using said error signal to reduce the phase noise of said ultra-high micro-wave frequency via feedback to said VCO.

In a 26th aspect, a source of low phase noise microwave frequencies is provided. The source comprises: a continuous wave (cw) laser; a cw laser output divided optically into a slave and master system by an optical splitter; said master system comprising a micro-comb configured for broadband supercontinuum generation seeded by said cw laser; said slave system including a modulator arrangement downstream from said splitter; said modulator driven by a voltage controlled oscillator (VCO); a supercontinuum generation stage downstream from said modulator arrangement; at least one optical beam splitter to combine the spectral output from said master and slave system and at least one narrow bandpass optical filter configured to isolate a spectral region common to both the master and slave system from said combined spectral output; and at least one detector configured to detect a beat signal in said isolated spectral region corresponding to interference of comb modes originating from said master and slave system, said beat signal comprising amplified phase noise from said micro-wave frequency generated by said VCO; a servo loop using feedback from said beat signal to reduce the phase noise of said micro-wave frequency.

In a 27th aspect, a source of low phase noise microwave frequencies according to aspect 26, further comprising at least one transfer oscillator configured to facilitate detection of a beat signal in said isolated spectral region corresponding to interference of comb modes originating from said master and slave system.

In a 28th aspect, a method for providing low phase noise microwave frequencies is provided. The method comprises generating comb modes using a low phase noise free running mode locked comb laser; modulating a cw laser at a modulation frequency, wherein said modulating comprises driving by a micro-wave frequency generated from a controllable microwave generator, generating side-bands to the cw laser in the frequency domain with a frequency spacing given by the modulation frequency; nonlinearly broadening a spectral extent of said side-bands, using two detectors to detect two primary beat signals between two individual comb modes from said comb laser with the frequency side-bands from the cw laser, mixing, with a radio frequency (RF) mixer, said two primary beat signals thereby generating a secondary beat signal, said secondary signal comprising amplified phase noise from said micro-wave frequency generated by said controllable microwave generator; and using feedback from said secondary beat signal to reduce the phase noise of said micro-wave frequency.

In a 29th aspect, a method of providing low phase noise microwave frequencies is provided. The method comprises generating RF from a voltage controller oscillator (VCO) using free running mode locked laser frequency combs as low noise frequency references; and comparing individual comb frequencies with a VCO driven RF modulated cw laser.

In a 30th aspect, the method of aspect 29, further comprising using for feedback a beat signal generated from the RF modulated cw laser with individual comb frequencies, said feedback reducing the noise of the VCO in the RF domain, including frequencies having a high frequency offset from the RF carrier frequency.

In a 31st aspect, a source of low phase noise microwave frequencies is provided. The source comprises a mode locked comb laser; a cw laser generating a cw output; an optical modulator operatively arranged to modulate said cw output, wherein said optical modulator is driven by a microwave frequency generated with a controllable microwave generator, said optical modulator generating side-bands in the frequency domain with a frequency spacing given by the modulation frequency of the optical modulator; a nonlinear medium disposed downstream from said optical modulator to nonlinearly broaden the spectral extent of said side-bands; a detector arrangement configured to detect primary beat signals between two individual comb modes from said comb laser with the frequency side-bands; and a radio frequency (RF) mixer to mix said two primary beat signals thereby generating a secondary beat signal, said secondary beat signal comprising amplified phase noise from said microwave frequency generated by said controllable microwave generator; a servo loop using feedback from said secondary beat signal to reduce the phase noise of said micro-wave frequency.

In a 32nd aspect, the source of low phase noise microwave frequencies according to aspect 31, wherein said controllable microwave generator comprises a voltage controlled oscillator (VCO).

In a 33rd aspect, a source of low phase noise microwave frequencies is provided. The source comprises: a mode locked comb laser; at least one optical filter to isolate a comb mode generated with the comb laser; said isolated comb mode being modulated with an optical modulator; wherein said optical modulator is driven by a micro-wave frequency generated with a controllable microwave generator, said optical modulator generating side-bands to the isolated comb mode in the frequency domain with a frequency spacing given by the modulation frequency of the optical modulator; a nonlinear medium configured to nonlinearly broaden the spectral extent of said side-bands, a detector arrangement configured to detect primary beat signals between at least one individual comb mode from said comb laser with the frequency side-bands from the isolated comb mode; and said beat signal comprising amplified phase noise from said micro-wave frequency generated by said controllable microwave generator; a servo loop using feedback from said beat signal to reduce the phase noise of said micro-wave frequency.

In a 34th aspect, a method of providing low phase noise microwave frequencies at a frequency MWF is provided. The method comprises generating said frequency MWF from a voltage controller oscillator (VCO) using a free running mode locked laser frequency comb operating at a repetition frequency CF as a low noise frequency reference; and transferring the phase noise power of the free running mode locked frequency comb at CF to the phase noise power at the MWF with an amplification factor substantially determined by $(MWF/CF)^2$ via a VCO, comparing at least one comb line from said frequency comb to a frequency sideband of a cw laser generated by a modulator operating at the MWF or a sub-harmonic of said MWF.

CONCLUSION

Thus, the invention has been described in several embodiments. It is to be understood that the embodiments are not mutually exclusive, and elements described in connection with one embodiment may be combined with, or eliminated from, other embodiments in suitable ways to accomplish desired design objectives.

For purposes of summarizing the present disclosure, certain aspects, advantages and novel features of the present disclosure are described herein. It is to be understood, however, that not necessarily all such advantages may be achieved in accordance with any particular embodiment. Thus, the present invention may be embodied or carried out in a manner that achieves one or more advantages without necessarily achieving other advantages as may be taught or suggested herein. No feature or group of features is necessary or indispensable for each embodiment.

The term "or" is used in this application its inclusive sense (and not in its exclusive sense), unless otherwise specified. Thus, the use of "or" in a list is meant to include one, some, or all members of the list. In addition, the articles "a", "an", and "the" as used in this application and the appended claims are to be construed to mean "one or more" or "at least one" unless specified otherwise. As used herein, a phrase such as "nearly all" with regard to a property or characteristic refers to an arrangement of components in which a large majority of the components include that property or characteristic. For example, in various embodiments, "nearly all" arrangements may incorporate greater than 70%, greater than 80%, or greater than 90% components that have the property or characteristic. In various embodiments, "nearly all" arrangements may include fewer than 2, 3, 5, or 10 components that do not have the property or characteristic.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present.

Thus, while only certain embodiments have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the embodiments described therein.

What is claimed is:

1. A source of low phase noise microwave frequencies, said source comprising:
    a continuous wave (cw) laser;
    said cw laser configured to be modulated with an optical modulator;

said optical modulator configured to be driven by a microwave frequency, said optical modulator configured to generate side-bands to the cw laser in a frequency domain with a frequency spacing given by a modulation frequency of the optical modulator;

a nonlinear medium to nonlinearly broaden the spectral extent of said side-bands and to generate a supercontinuum spectrum;

a nonlinear interferometer configured to generate a beat signal; and a detector to detect said beat signal;

wherein said beat signal comprises amplified phase noise from said microwave frequency, and wherein said source is configured to use feedback from said beat signal to reduce the amplified phase noise from said microwave frequency.

2. The source of low phase noise microwave frequencies according to claim 1, wherein said nonlinear interferometer comprises an f-2f interferometer.

3. The source of low phase noise microwave frequencies according to claim 2, wherein said nonlinear interferometer comprises a nonlinear waveguide.

4. The source of low phase noise microwave frequencies according to claim 1, wherein said low phase noise is obtainable with microwave frequencies greater than about 25 GHz and up to about 1000 GHz, and wherein said phase noise is lower than −120 dBc/Hz at a frequency offset of about 100 kHz.

5. The source of low phase noise microwave frequencies according to claim 1, further comprising:

a radio frequency (RF) reference configured to provide an RF reference signal which, together with an output of said detector, provides for generation of an error signal and reduction of phase noise via said feedback.

6. The source of low phase noise microwave frequencies according to claim 5, wherein said feedback comprises a feedback loop.

7. The source of low phase noise microwave frequencies according to claim 5, said source comprising: a controllable microwave generator configured to receive said error signal and to generate a phase-noise reduced output thereof.

8. The source of low phase noise microwave frequencies according to claim 7, wherein said phase-noised reduced output of said controllable microwave generator is coupled to said optical modulator via a feedback arrangement.

9. The source of low phase noise microwave frequencies according to claim 7, wherein said controllable microwave generator comprises a voltage controlled oscillator (VCO).

10. The source of low phase noise microwave frequencies according to claim 1, wherein said nonlinear interferometer comprises a 2f-3f interferometer or a 3f-4f interferometer.

11. The source of low phase noise microwave frequencies according to claim 1, wherein said nonlinear interferometer comprises a waveguide interferometer.

12. The source of low phase noise microwave frequencies according to claim 11, wherein said waveguide interferometer comprises a periodically poled Lithium Niobate (PPLN) waveguide arranged in a 2f-3f interferometer configuration in which a 2f-3f beat signal at a red wavelength is generated.

13. The source of low phase noise microwave frequencies according to claim 1, wherein said optical modulator comprises: one or more cascaded phase modulators disposed downstream from said cw laser and arranged such that an output of said cw laser, including the spectral content of said side-bands, is frequency broadened via phase modulation.

14. The source of low phase noise microwave frequencies according to claim 1, wherein said source comprises at least one fiber amplifier disposed between said optical modulator and said nonlinear medium.

15. The source of low phase noise microwave frequencies according to claim 14, wherein said at least one fiber amplifier comprises an Erbium-doped amplifier.

16. The source of low phase noise microwave frequencies according to claim 1, wherein said optical modulator is configured to generate a pulse train at a repetition rate corresponding to said modulation frequency, said source further comprising an optical amplitude modulator configured to reduce the repetition rate of said pulse train to a reduced repetition rate.

17. The source of low phase noise microwave frequencies according to claim 16, further configured to inject the pulse train at said reduced repetition rate into said nonlinear medium.

18. The source of low phase noise microwave frequencies according to claim 16, wherein said optical modulator is configured to drive a frequency near 25 GHz.

19. The source of low phase noise microwave frequencies according to claim 16, wherein said reduced repetition rate is near 1 GHz.

* * * * *